(12) United States Patent
Liao et al.

(10) Patent No.: US 11,532,573 B2
(45) Date of Patent: Dec. 20, 2022

(54) METHOD FOR FORMING SEMICONDUCTOR DEVICE

(71) Applicant: TAIWAN SEMICONDUCTOR MANUFACTURING COMPANY LTD., Hsinchu (TW)

(72) Inventors: Wen-Shiang Liao, Miaoli County (TW); Huan-Neng Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/930,972

(22) Filed: May 13, 2020

(65) Prior Publication Data
US 2020/0273820 A1    Aug. 27, 2020

Related U.S. Application Data

(62) Division of application No. 15/842,661, filed on Dec. 14, 2017, now Pat. No. 10,665,554.
(Continued)

(51) Int. Cl.
*H01L 23/66*    (2006.01)
*H01L 23/498*    (2006.01)
(Continued)

(52) U.S. Cl.
CPC .......... *H01L 23/66* (2013.01); *H01L 23/3675* (2013.01); *H01L 23/49827* (2013.01);
(Continued)

(58) Field of Classification Search
CPC . H01L 23/66; H01L 23/5383; H01L 23/5384; H01L 23/49816; H01L 23/3135; H01L 23/3128; H01L 23/49827; H01L 23/5386; H01L 23/3675; H01L 23/367; H01L 23/42; H01L 24/02; H01L 24/97; H01L 24/81; H01L 25/0655; H01L 25/18; H01L 2223/6627; H01L 2223/6616; H01L 2224/02331; H01L 2224/02373; H01L 2224/02381; H01L 2224/16238; H01L 2224/16237; H01L 2224/81005; H01L 2224/16148; H01L 21/6835;
(Continued)

(56) References Cited

U.S. PATENT DOCUMENTS 6,975,189 B1 * 12/2005 Reamon ............... H01L 23/5225
257/664
9,379,069 B2 * 6/2016 Chen .................. H01L 21/76883
(Continued)

*Primary Examiner* — Natalia A Gondarenko
(74) *Attorney, Agent, or Firm* — WPAT; Anthony King

(57) ABSTRACT

A semiconductor device is disclosed. The semiconductor device includes a first die on a first substrate, a second die on a second substrate separate from the first substrate, a transmission line in a redistribution layer on a wafer, and a magnetic structure surrounds the transmission line. The first transmission line electrically connects the first die and the second die. The magnetic structure is configured to increase the characteristic impedance of the transmission line, which can save the current and power consumption of a current mirror and amplifier in a 3D IC chip-on-wafer-on-substrate (CoWoS) semiconductor package.

20 Claims, 21 Drawing Sheets

Related U.S. Application Data

(60) Provisional application No. 62/578,876, filed on Oct. 30, 2017.

(51) Int. Cl.
   *H01L 23/538* (2006.01)
   *H01L 23/367* (2006.01)
   *H01L 25/18* (2006.01)
   *H01L 23/00* (2006.01)
   *H01L 23/42* (2006.01)

(52) U.S. Cl.
   CPC ...... *H01L 23/5383* (2013.01); *H01L 23/5384* (2013.01); *H01L 23/5386* (2013.01); *H01L 24/02* (2013.01); *H01L 24/16* (2013.01); *H01L 24/97* (2013.01); *H01L 25/18* (2013.01); *H01L 23/367* (2013.01); *H01L 23/42* (2013.01); *H01L 23/49816* (2013.01); *H01L 2223/6616* (2013.01); *H01L 2223/6627* (2013.01); *H01L 2224/02331* (2013.01); *H01L 2224/02373* (2013.01); *H01L 2224/02381* (2013.01); *H01L 2224/16148* (2013.01); *H01L 2224/16238* (2013.01)

(58) Field of Classification Search
   CPC ... H01L 21/6836; H01L 21/56; H01L 21/568; H01L 21/563; H01L 2221/68345; H01L 2221/68331; H01L 2924/18161; H01L 2224/73204; H01L 2224/97; H01L 2224/81193; H01L 2224/81815; H01L 24/16–26; H01L 24/46–49; H01L 24/85; H01L 25/043; H01L 25/0657; H01L 25/50; H01L 2924/10253; H01L 2924/10271; H01L 2924/10272; H01L 2924/1033; H01L 2924/10329; H01L 2924/15192; H01L 2924/15151; H01L 2924/20101; H01L 2924/20102; H01L 2924/20104; H01L 2924/3025; H01L 2924/2351; H01L 2924/014; H01L 23/053; H01L 23/481; H01L 23/49811; H01L 23/49838; H01L 23/49866; H01L 23/528; H01L 23/9827; H01L 23/53238; H01L 23/552; H01L 23/5227; H01L 23/645
   USPC ..... 257/664, 693, 700, 728, 23.019, 23.102, 257/21.575, 21.507; 438/3, 107, 122
   See application file for complete search history.

(56) References Cited

U.S. PATENT DOCUMENTS

| | | | |
|---|---|---|---|
| 9,543,242 B1* | 1/2017 | Kelly | H01L 23/49822 |
| 2008/0157911 A1* | 7/2008 | Fajardo | H01F 41/24 336/175 |
| 2015/0076682 A1* | 3/2015 | Wu | H01L 24/97 257/693 |
| 2015/0102472 A1* | 4/2015 | Tsai | H01L 23/552 257/659 |
| 2015/0371772 A1* | 12/2015 | Jou | H01F 41/046 427/58 |
| 2016/0027750 A1* | 1/2016 | Kuo | H01L 24/81 257/737 |
| 2018/0190635 A1* | 7/2018 | Choi | H01L 25/0652 |

\* cited by examiner

METHOD FOR FORMING SEMICONDUCTOR DEVICE

CROSS REFERENCE TO RELATED APPLICATIONS

This patent is a divisional application of U.S. patent application Ser. No. 15/842,661 filed on Dec. 14, 2017, entitled of "MAGNETIC STRUCTURE FOR TRANSMISSION IN A PACKAGE SYSTEM", which claims priority to U.S. provisional application Ser. No. 62/578,876, filed Oct. 30, 2017, the entire disclosure of which is hereby incorporated by reference.

BACKGROUND

In advanced semiconductor technologies, the continuing reduction in device size and increasingly complicated circuit designs has made circuit design and fabrication of integrated circuits (ICs) more challenging and costly. As far as interconnect is concerned, scaling reduces delay of logic gates but not wires. As a result, latency may be relatively large across chip, bandwidth is RC limited, and energy consumption is high and not scalable. Future microprocessors may encounter communication congestion. RF interconnect therefore has been proposed. With RF interconnect, data transmit through transmission lines at the speed of light, with less dispersion across the band and less baseband interference. Moreover, data rate is only limited by CMOS mixer modulation speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
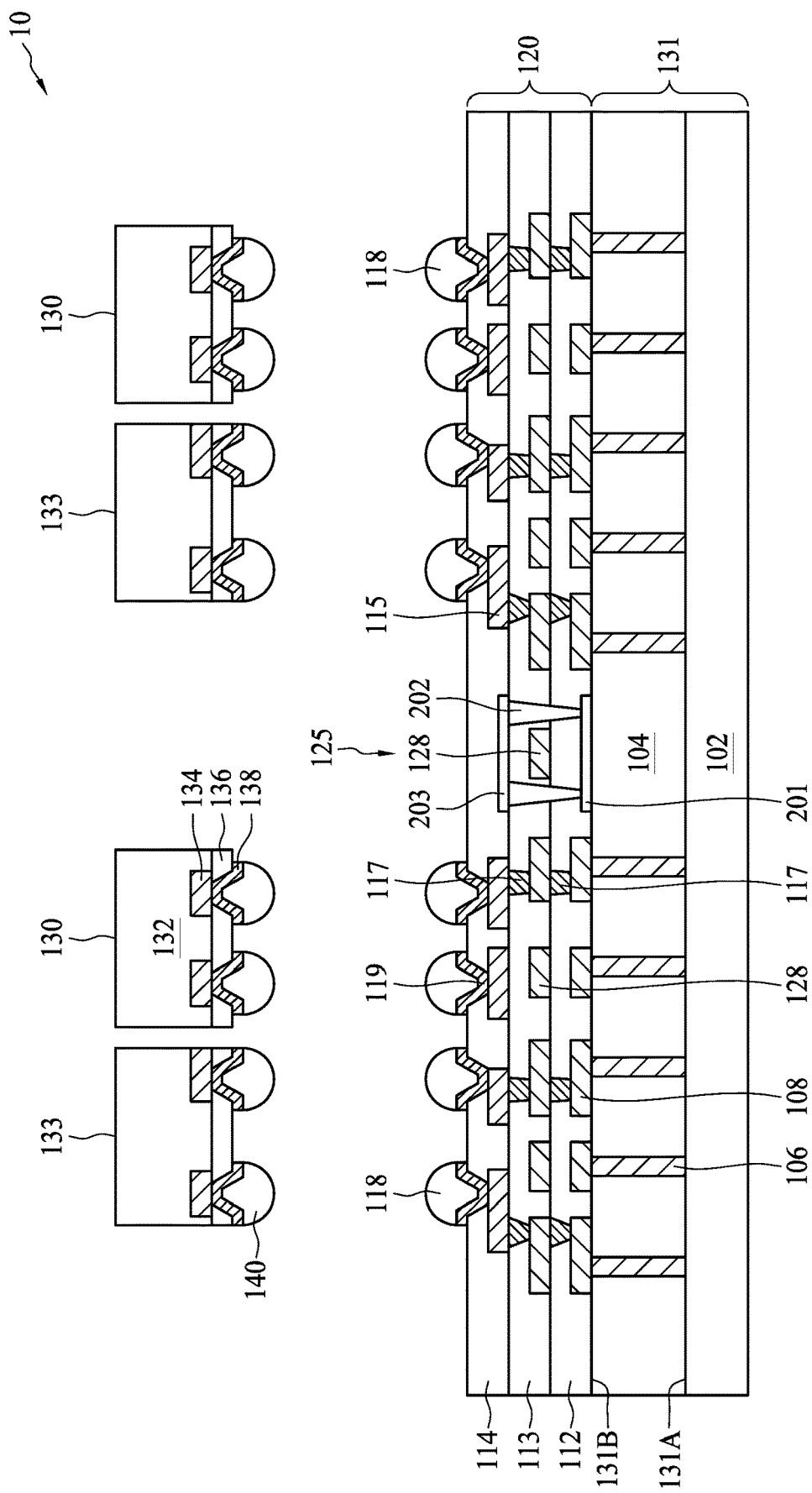
FIG. 1 is a cross-sectional view of a semiconductor device including a magnetic structure, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure presents a semiconductor device and a method of manufacturing the same. In some embodiments, a magnetic structure is formed in a chip-on-wafer-on-substrate (CoWoS) semiconductor package. The magnetic structure surrounds one or more transmission lines and facilitates increase in characteristic impedance of the transmission lines and in magnetic flux in a fan-out wafer level package (FOWLP) process. Further, transmission lines with increased characteristic impedance help reduce power consumption in current amplifiers associated with the transmission lines, resulting in efficient power management. The present disclosure also presents the intermediate stages of forming the semiconductor device. Some variations of some embodiments are also discussed. Like reference numerals are used throughout various views and embodiments to designate like elements.

FIG. 1 is a cross-sectional view of a semiconductor device 10 including a magnetic structure 125, in accordance with an embodiment.

Referring to FIG. 1, the semiconductor device 10 includes a wafer 131, first semiconductor dies 130 and second semiconductor dies 133 for a chip-on-wafer (CoW) process. First dies 130 and second dies 133 are disposed in groups and each group may be arranged in an array. Alternatively, the first dies 130 and second dies 133 in a group may be a collection of different semiconductor dies with different structures and functions. For example, the first die 130 may include a memory device with programmable memory storage such as flash or EEPROM device, while the second die 133 may include a microprocessor with an application specific processor such as a baseband transceiver, a graphics processor, a cache memory device, a memory management device, and an analog to digital converter for sensor applications.

Each of the first dies 130 and second dies 133 includes a substrate (or called die substrate) 132. The substrate 132 includes a semiconductor material, such as silicon. Alternatively, the substrate 132 may include other semiconductor materials, such as silicon germanium, silicon carbide, gallium arsenide, or the like. The substrate 132 may be a p-type semiconductive substrate (acceptor type) or n-type semiconductive substrate (donor type). In an alternative, the substrate 132 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GiaInAs, GaInP, and/or GaInAsP; or combinations thereof. In another alternative, the die substrate 132 is a semiconductor-on-insulator (SOI). In yet another alternative, the substrate 132 may include a doped epi layer, a gradient semiconductor layer, and/or a semiconductor layer overlying another semiconductor layer of a different type, such as a silicon layer on a silicon germanium layer.

Various components, such as active devices, passive components, conductive portions or insulating materials may be formed in the die substrate 132. In addition, each of the first dies 130 and second dies 133 includes one or more connection terminals 134, which are referred to as conductive pads or bond pads. The embedded components of the die substrate 132 are electrically coupled to external circuits or devices through the connection terminals 134.

A dielectric layer 136 or a passivation layer is deposited on the connection terminals 134. The dielectric layer 136 may be provided by initially forming a blanket layer through a suitable process, such as chemical vapor deposition (CVD), physical vapor deposition (PVD), atomic layer deposition (ALD), or the like. Later, lithographic and etching processes are performed on a photoresist (not separately shown) in order to expose the connection terminal 134, thus forming respective openings thereon. The undesired portion of the dielectric material is removed, resulting in the dielectric layer 136 as shaped. The dielectric layer 136 may be formed with a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, and the like.

Moreover, a conductive layer is deposited on the connection terminal 134 and then patterned to form an under bump metallization (UBM) 138, which is also referred to as ball-limiting metallurgy (BLM). The UBM 138 defines a size of a connector, such as a conductive bump, to be formed thereon after a reflow operation, and reacts with the connector so as to provide effective adhesion and a barrier between the connector and underlying structures. In the present embodiment, the UBM 138 provides additional adhesion between the connection terminals 134 and connectors 140. In some embodiments, the UBM 138 may increase solderability of the connectors 140. Materials of the UBM 138 include, for example, titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM 138 comprises a layered structure comprising different conductive material sublayers.

The connectors 140 are formed subsequent to the formation of the UBM 138. The connectors 140 are formed of conductive materials, such as tin, copper, nickel, or the like. The connectors 140 may be implemented as conductive bumps, such as micro bumps, or controlled collapse chip connection (C4) bumps. The connectors 140 are formed by any suitable operations, such as dropping balls, solder paste in a screen printing operation, electrodeless or electroplating approaches, controlled collapse chip connection (C4) plating or C4NP (C4 New Process) solder transfers.

The wafer 131 comprises substrate materials of, for example, silicon or other suitable substrate materials 104 such as ceramic, glass, plastic, resin or epoxy. In addition, the wafer 131 includes through substrate vias (TSVs) 106 running along a vertical direction substantially perpendicular to the surface of the wafer 131. In an embodiment, the TSVs 106 may extend from a first surface 131A to a second surface 131B, where the TSVs 106 are also regarded as through interposer vias (TIV) if the wafer 131 is diced. In an embodiment, the wafer 131 is an interposer wafer, providing interconnection features for adjacent dies or devices. In that case, there may be no active or passive devices formed in the wafer 131, except for the TSVs 106.

In an embodiment, a carrier 102 is disposed under the wafer 131. The carrier 102 holds and supports the wafer 131 for the subsequent processes, and may be thinned, removed, or released from the wafer 131 in subsequent operations. The carrier 102 is made of any strippable or easily removed material, for example, films, tapes, liquid adhesives and the like.

A redistribution layer (RDL) 120 is formed over the second surface 131B of the wafer 131. The RDL 120 includes patterned conductors 108, 128 and 117, and dielectric layers 112 and 113. The dielectric layers 112 and 113 are used for electrically insulating the conductive features 108, 128 and 117. The dielectric layers 112 and 113 are made of dielectric material including, for example, oxide or nitride. The patterned conductors 108, 128 and 117 are arranged as laterally extending conductive lines 108, 128 and vertically extending conductive vias 117, and collectively constitute a re-routed conductive layout for the dies 130. Moreover, the conductive lines 108 may be orthogonal to the conductive lines 128. Further, the conductive lines 108 are coupled with the TSVs 106 in order to create an electrical connection. The conductive lines 108, 128 and the conductive vias 117 are made of conductive material suitable for interconnection, for example, copper, silver, aluminum, tungsten, a combination thereof, of the like. By using the RDL 120, changes of the dies 130, 133 or the conductive bump patterns are made without modifying the system board since the dies 130 and 133 are allowed to communicate each other through the RDL 120. The RDL 120 thus is able to change the layout of new dies or new bump patterns for particular functions. This flexibility saves cost and allows any changes of dies or die vendors. In the present embodiment, two exemplary layers of conductive lines 108 and 128 are shown for illustrated purposes only. Variations and modifications for the RDL 120 are within the contemplated scope of the present disclosure, such as more layers of conductive lines interconnected through conductive vias 117 and more layers of dielectric materials 112 and 113 formed therebetween.

Figure 2:
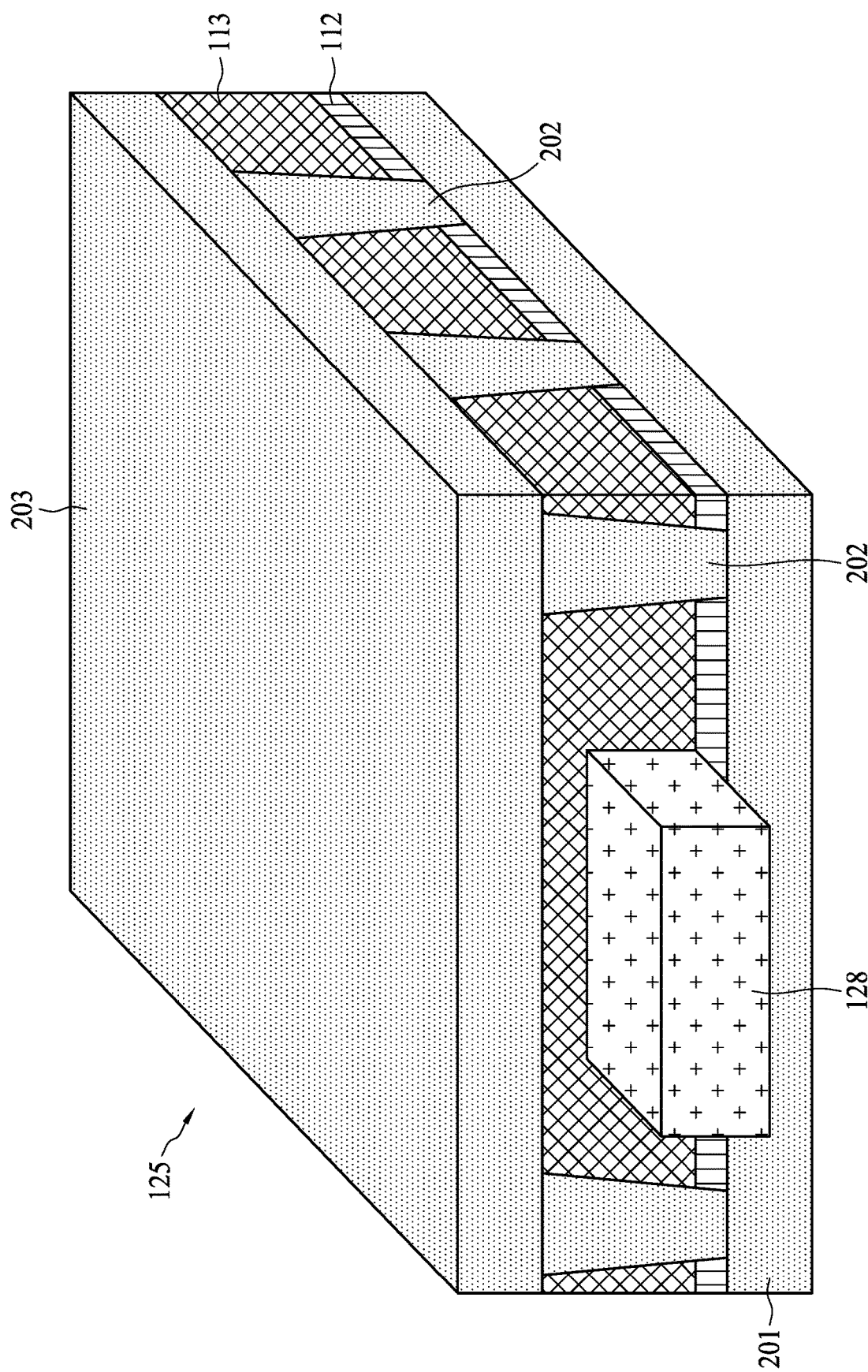
FIG. 2 is a schematic perspective view of the magnetic structure illustrated in FIG. 1.

A magnetic structure 125, which surrounds one of the conductive lines 128, is formed in the RDL 120. A method of forming the magnetic structure 125 will be discussed in detail with reference to FIGS. 4A to 4E. FIG. 2 is a schematic perspective view of the magnetic structure 125 illustrated in FIG. 1. Referring to FIG. 2, the magnetic structure 125 includes a lower layer 201, an upper layer 203 and connecting vias 202 between the lower layer 201 and the upper layer 203. The conductive line 128 is surrounded by the dielectric layers 112 and 113.

Figure 3:
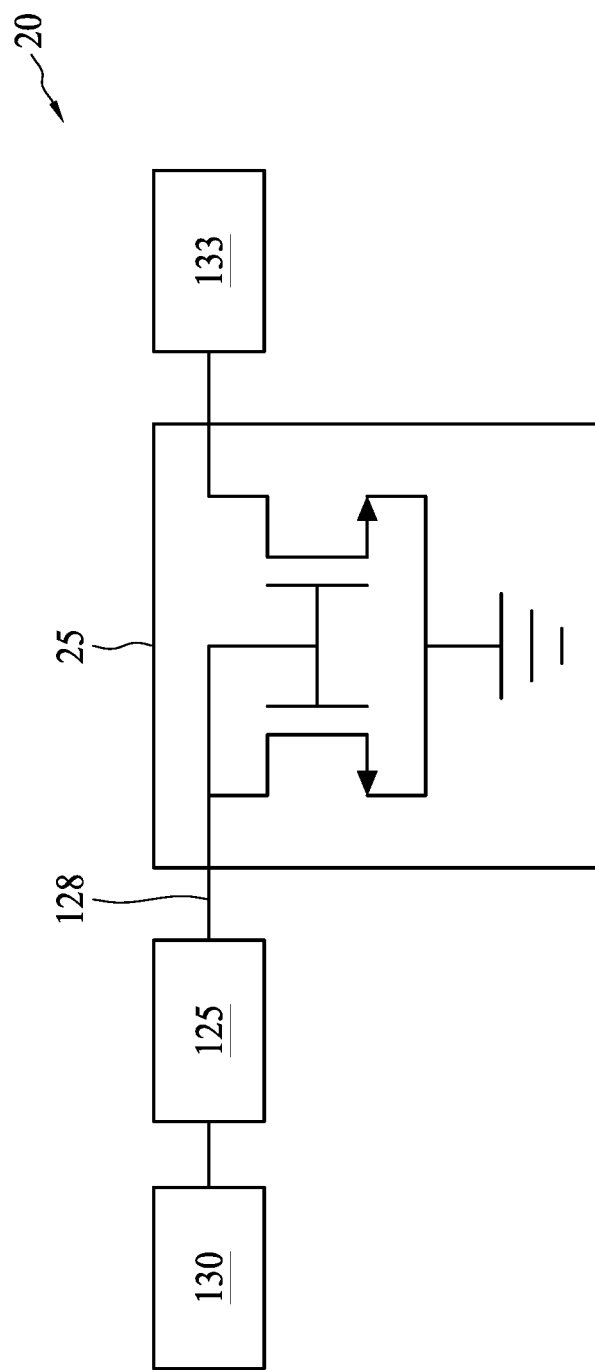
FIG. 3 is a block diagram of a circuit in the semiconductor device including the magnetic structure, in accordance with an embodiment.

FIG. 3 is a block diagram of a circuit 20 in the semiconductor device 10 including the magnetic structure 125, in accordance with an embodiment.

Referring to FIG. 3, the transmission line 128, surrounded by the magnetic structure 125, connects the first die 130 to the second die 133, or vice versa, via a current mirror and amplifier 25, The magnetic structure 125 increases a characteristic impedance of the transmission line 128. The transmission line 128 with increased characteristic impedance reduces current consumption of the current mirror and amplifier 25. Since the current mirror and amplifier 25 becomes more power efficient, the transmission line 128 can be allowed to be designed with a reduced length, which in turn allows more devices to be formed on the same area, resulting in an efficient area cost. In an embodiment, if the magnetic structure 125 increases the characteristic impedance from about 50Ω to about 250Ω, then current consumption by the current mirror and amplifier 25 is reduced from about 1.61 milliamps (mA) to about 0.32 mA.

The increased characteristic impedance may be determined in the following equation.

$$Z_0 = \frac{\sqrt{j\omega L + R}}{\sqrt{j\omega C + G}}$$

where Zo represents the impedance of the transmission line 128, j is an imaginary unit, ω represent angular frequency, L represents an inductance due to a magnetic field surrounding the transmission line 128 by the magnetic structure 125, R represents a resistance of the transmission line 128, C represents a capacitance across the transmission line 128, and G represents a conductance of the one or more dielectric layers 112, 113 electrically isolating the transmission line 128 from the magnetic structure 125.

According to the equation, the impedance (Zo) is increased by increasing at least one of the inductance (L) or the resistance (R). In an embodiment, the magnetic structure 125 increases the impedance (Zo) by increasing the inductance (L) without increasing the resistance (R). For example, the inductance (L) may be increased by increasing a distance between the transmission line 128 and a substrate. In another embodiment, the impedance (Zo) is increased by increasing the resistance (R). For example, the resistance (R) may be increased by decreasing the transmission line 128 in height.

In some existing approaches, 50-ohm (50Ω) transmission line is used for two-port networks. Such transmission line, however, may not be suitable for radio frequency (RF) interconnect in a fan-out wafer level packaging (FOWLP) process. For example, if a 50Ω transmission line is used for RF interconnect, a current mirror and amplifier associated with the transmission line may need to be designed with a larger gain in response to the relatively small input impedance, i.e., 50Ω. As a result, the current mirror and amplifier consumes more power due to higher current consumption, or needs a larger size. Accordingly, using 50Ω transmission line for RF interconnect may not be efficient in view of power management or area cost. In the embodiments of the present disclosure, the magnetic structure is used to increase the characteristic impedance of the transmission line within a 3D IC chip-on-wafer-on-substrate (CoWoS) semiconductor package, which can save the current and power consumption of a current mirror and amplifier.

Referring back to FIG. 1, another conductive layer is formed in the RDL 120 and then patterned to form conductive pads 115. The conductive pads 115 are made of conductive material, for example, aluminum, copper, copper alloys, or nickel. Later, a dielectric layer 114, which may serve as a protection layer of the RDL 120, is formed on the conductive pads 115. The dielectric layer 114 may be formed by, for example, chemical vapor deposition (CVD), atomic layer deposition (ALD), spin coating, evaporation, or the like. Subsequently, lithographic and etching processes are performed to expose the conductive pads 115, thus forming openings. A conductive layer is disposed on the conductive pads 115 and then patterned to form a UBM 119. The UBM 119 is in contact with the conductive pads 115 and supported by the dielectric layer 114.

Connectors 118 are formed on the UBM 119 of the RDL 120. The connectors 118 are used for electrically couple external devices, such as dies 130, 133 with the wafer 131. The connectors 118 may be implemented as conductive bumps, such as micro bumps, or controlled collapse chip connection (C4) bumps. The connectors 118 are formed of conductive materials, such as tin, copper, nickel, or the like. The connectors 118 may be formed by evaporation, an electroplating process, dropping balls, solder paste in a screen printing operation, electrodeless or electroplating approaches, C4 plating or C4NP solder transfers. Once formed, the connectors 118 are aligned with the corresponding connectors 140 of the dies 130 and 133, in order to aid the subsequent bonding operation.

A method of manufacturing the magnetic structure 125 will be discussed with reference to FIGS. 4A to 4E. Afterwards, the dies 130 and 133 are bonded to the wafer 131 through respective connectors 142. The bonding and its subsequent processes to form a CoW structure will be discussed with reference to FIGS. 4F to 4J. Subsequently, a CoWoS structure is formed, as will be discussed with reference to FIGS. 4K to 4O.

Figure 4A:
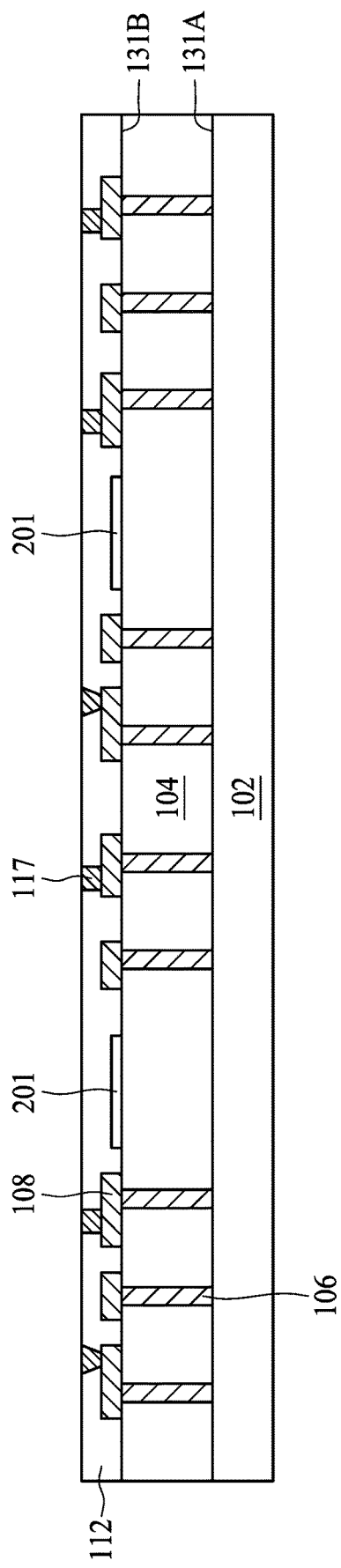
FIGS. 4A to 4O are cross-sectional views showing a method of forming a semiconductor device including a magnetic structure as illustrated in FIG. 1, in accordance with some embodiments.
Figure 4B:
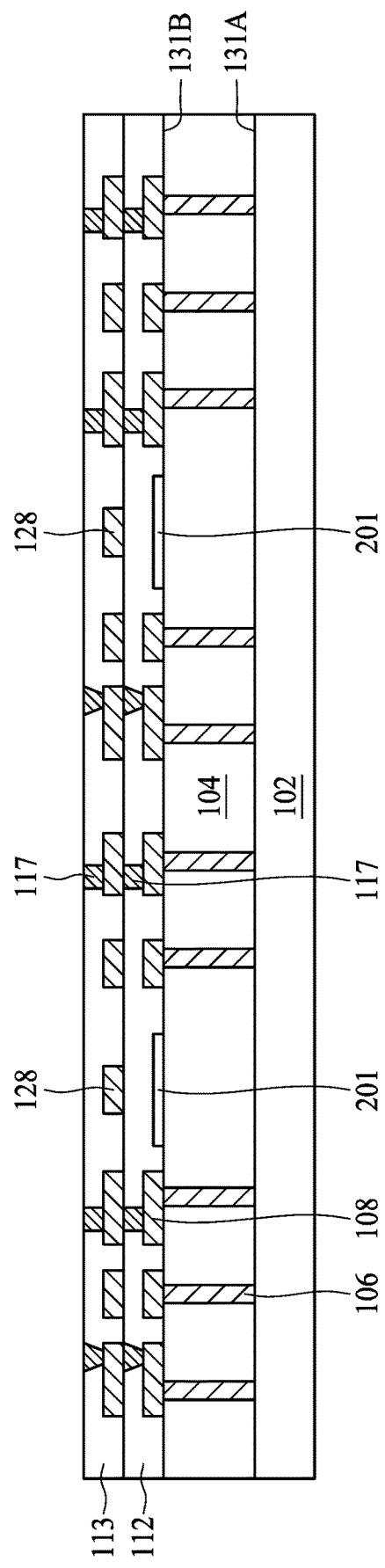
Figure 4C:
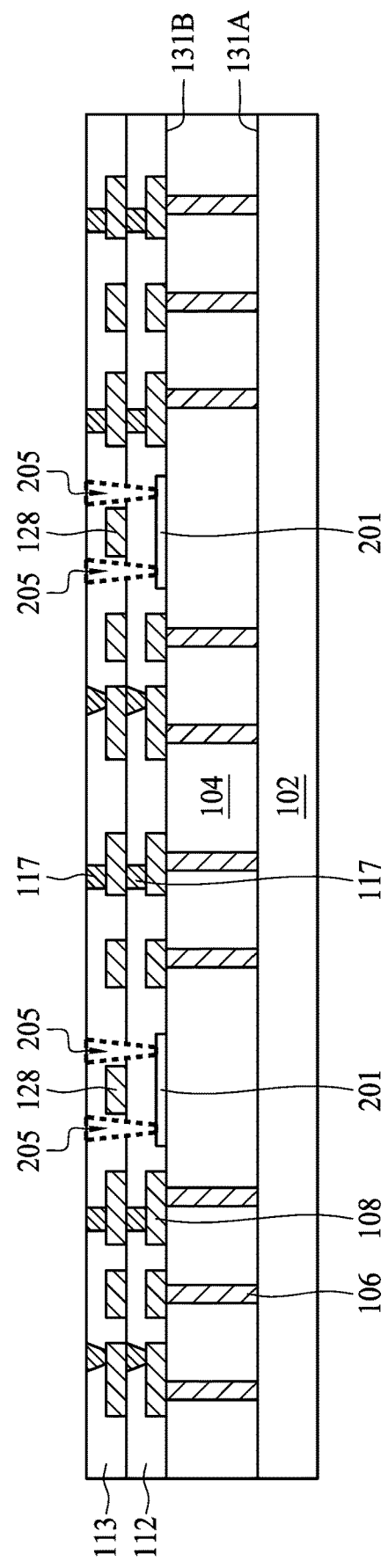
Figure 4D:
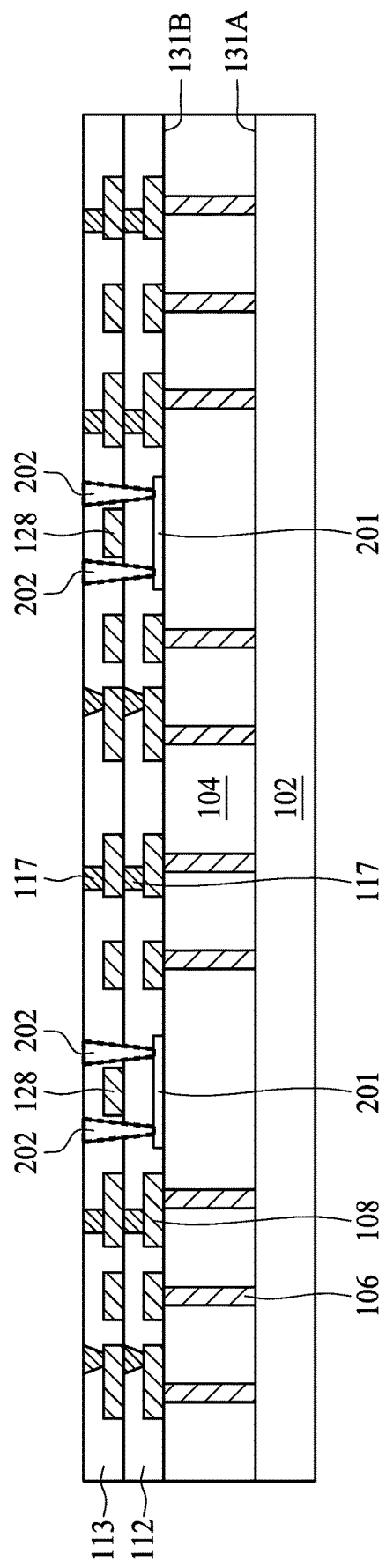
Figure 4E:
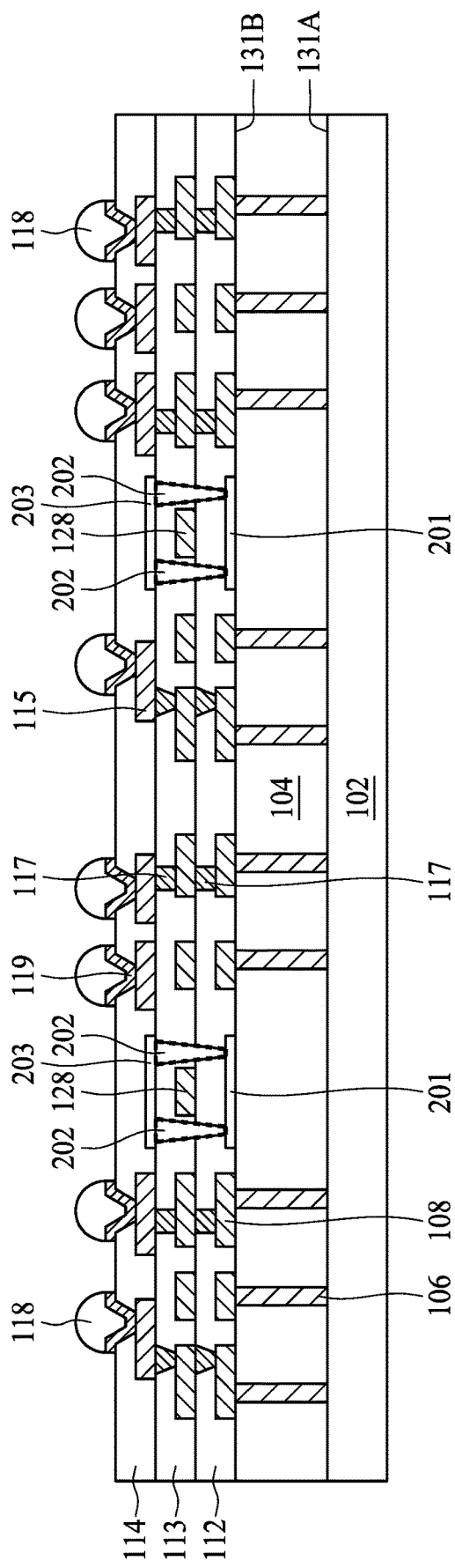
Figure 4F:
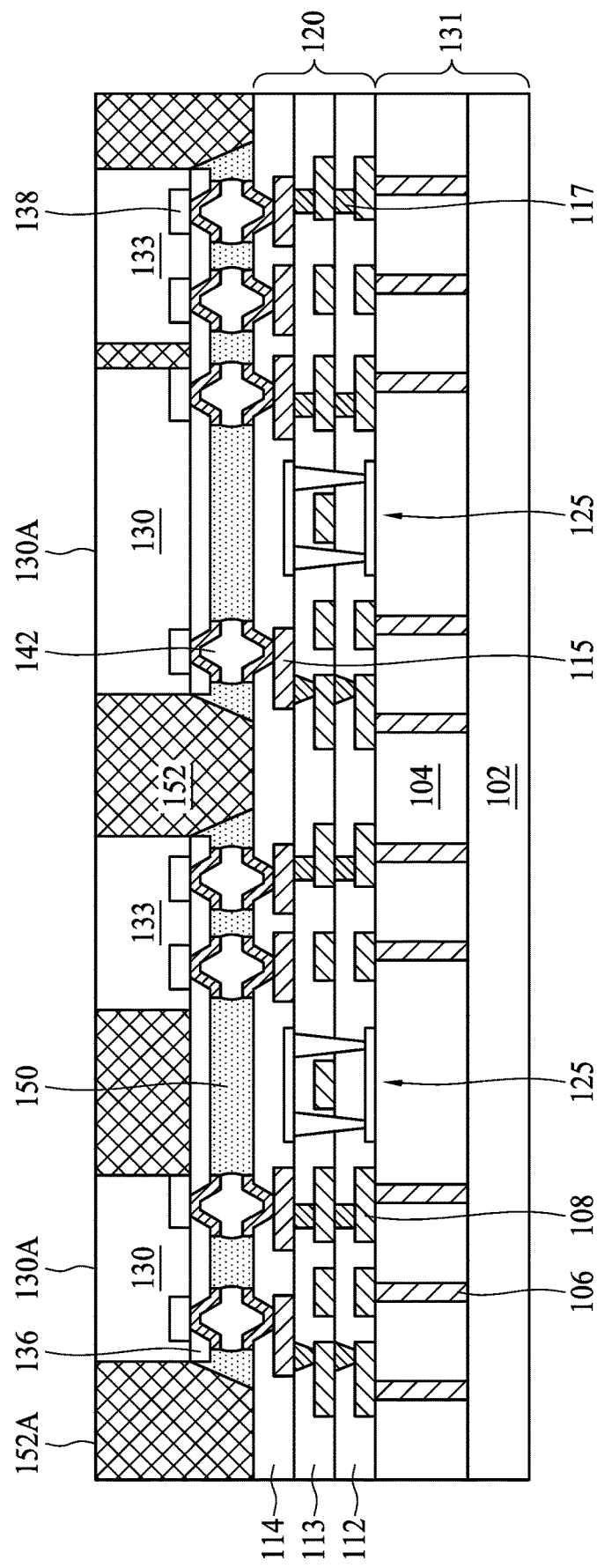
Figure 4G:
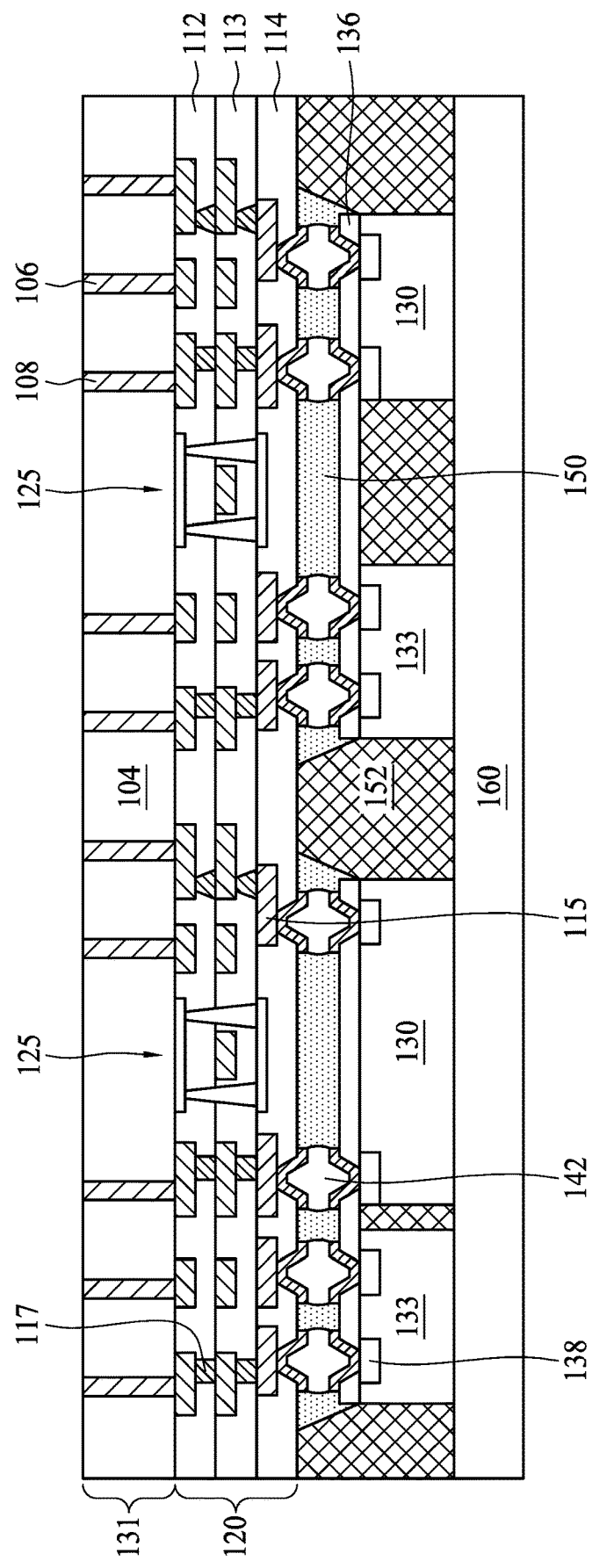
Figure 4H:
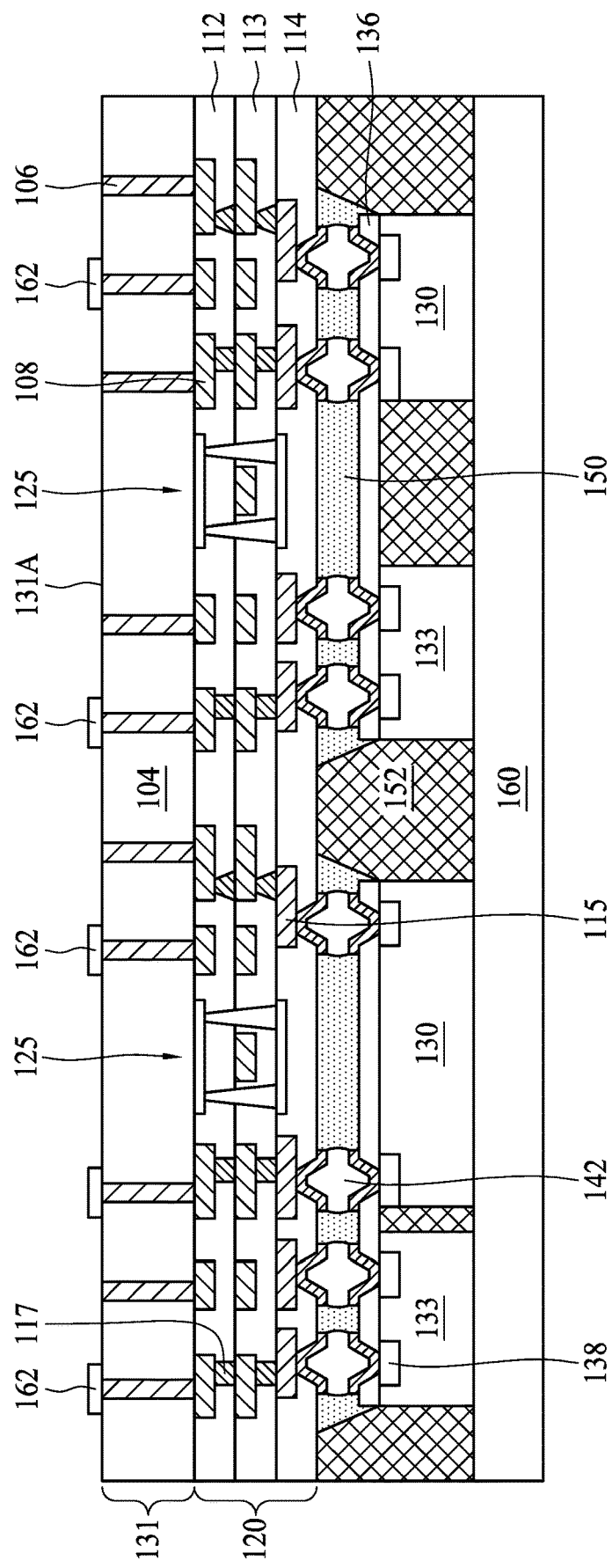
Figure 4I:
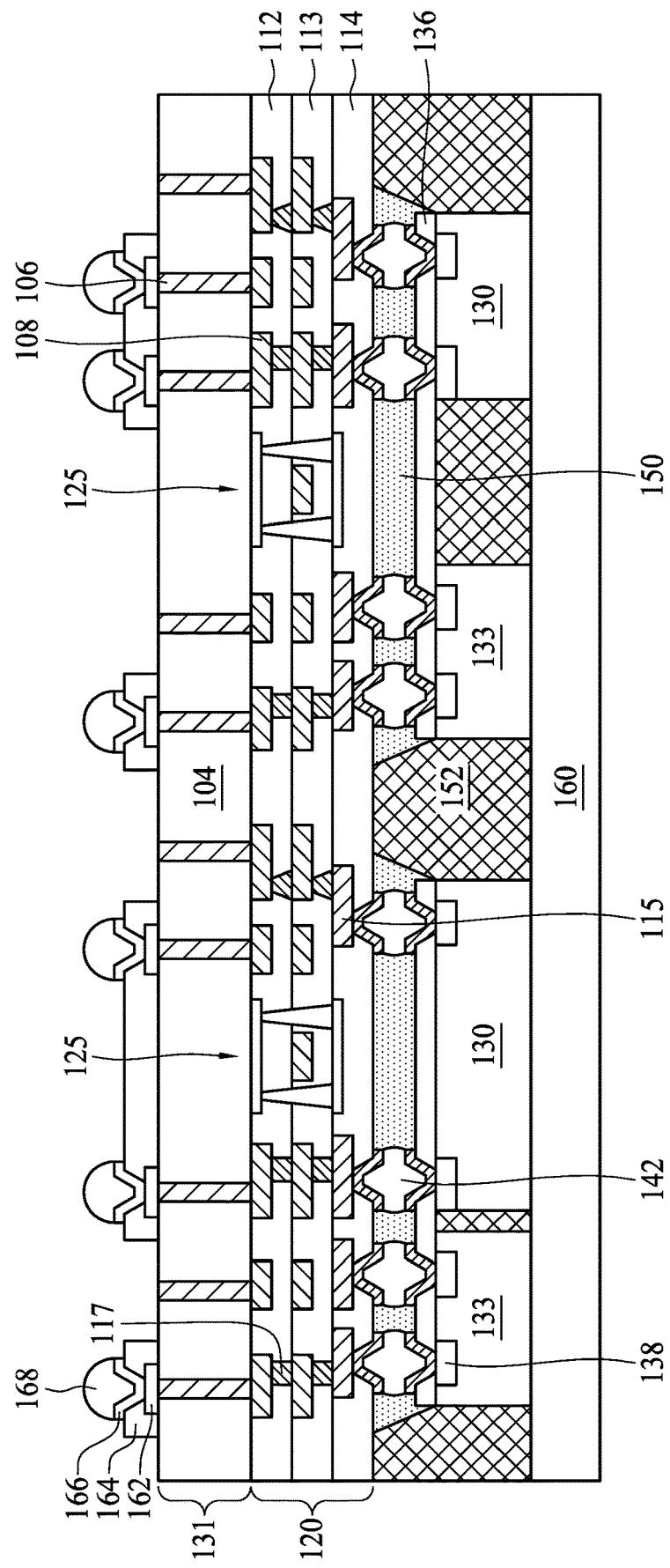
Figure 4J:
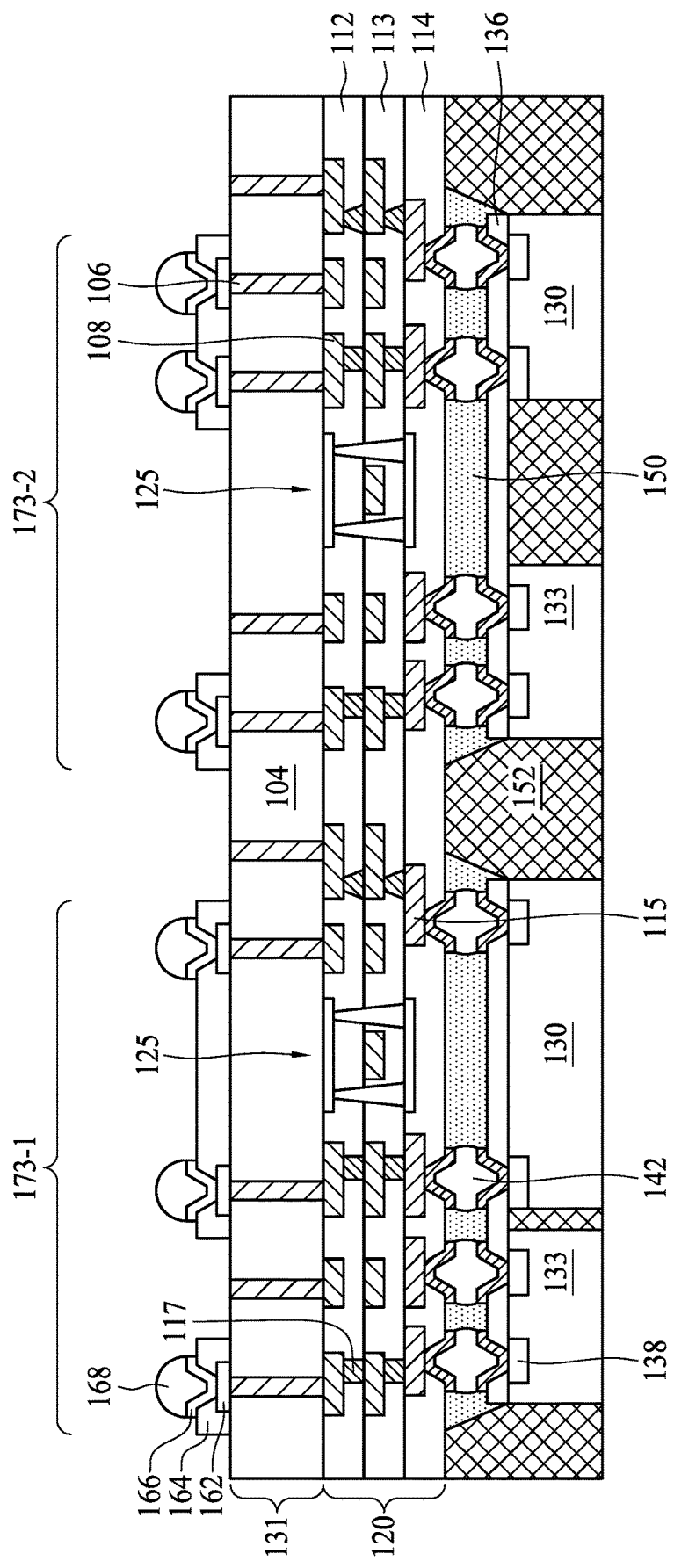
Figure 4K:
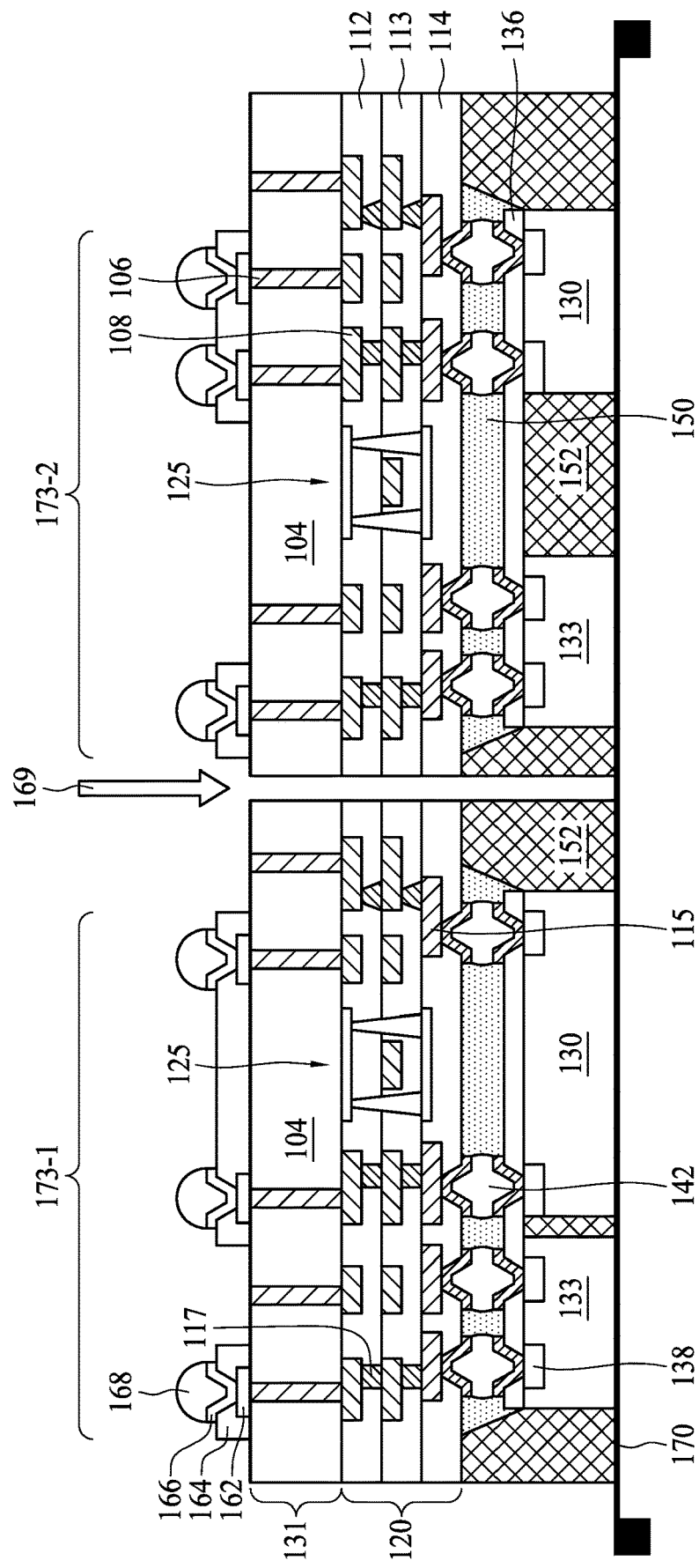
Figure 4L:
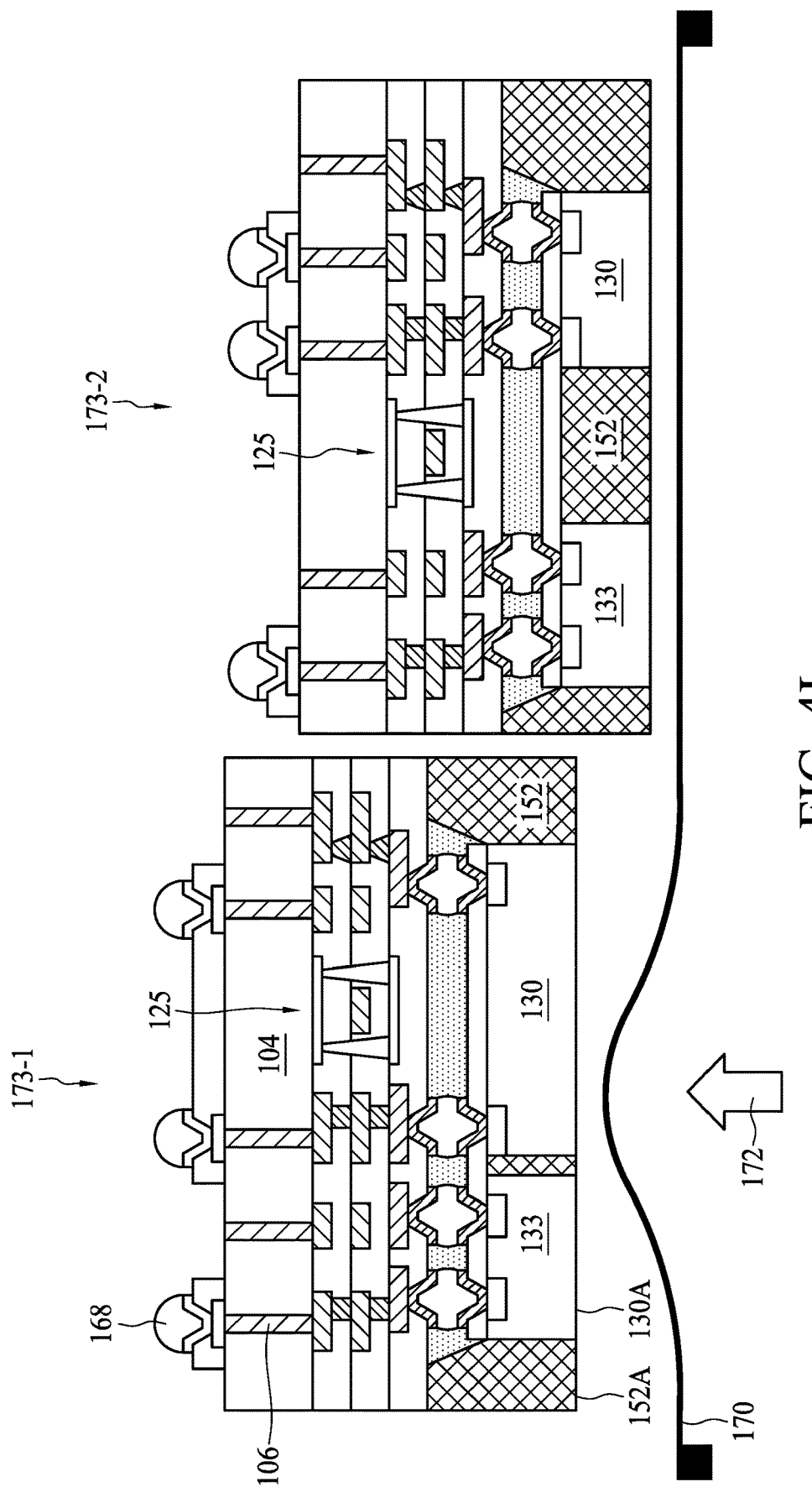
Figure 4M:
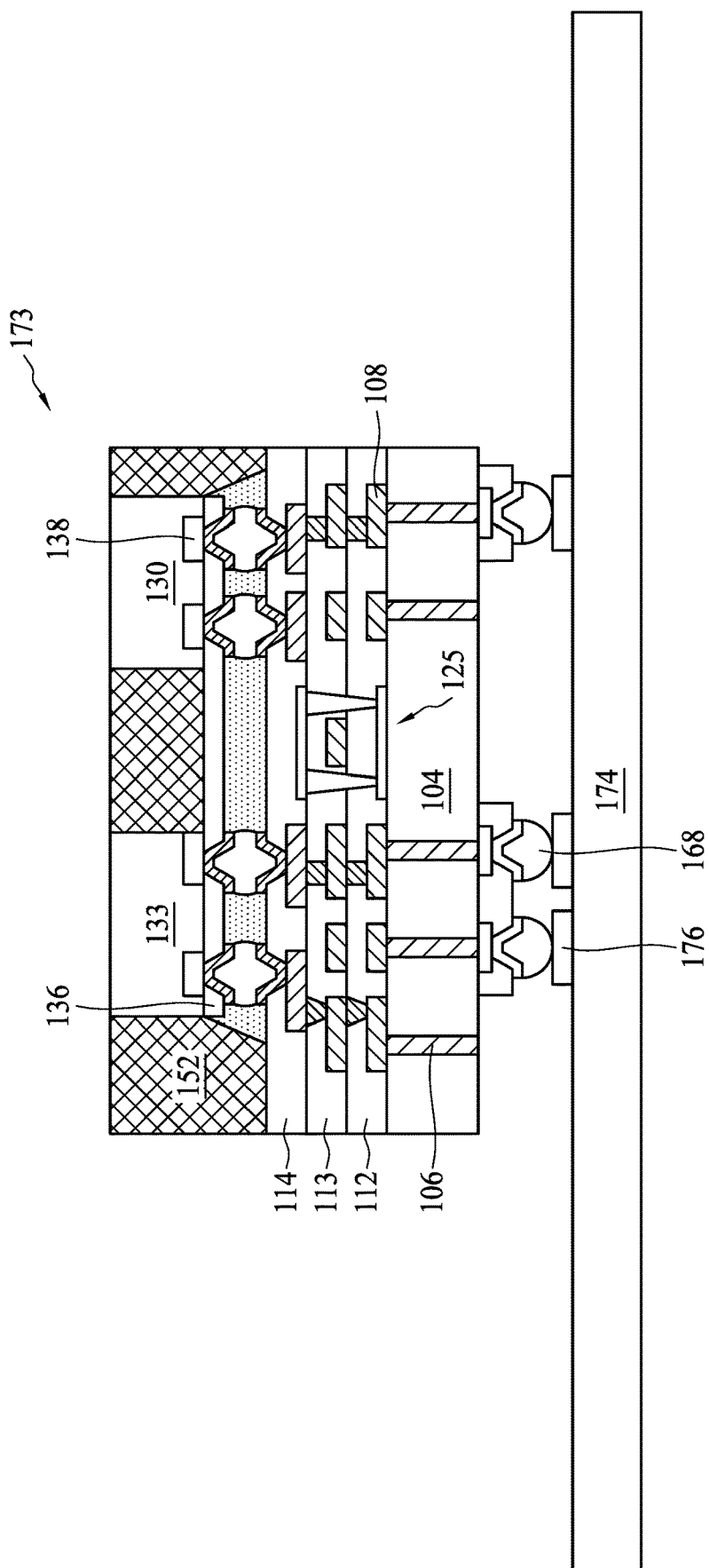
Figure 4N:
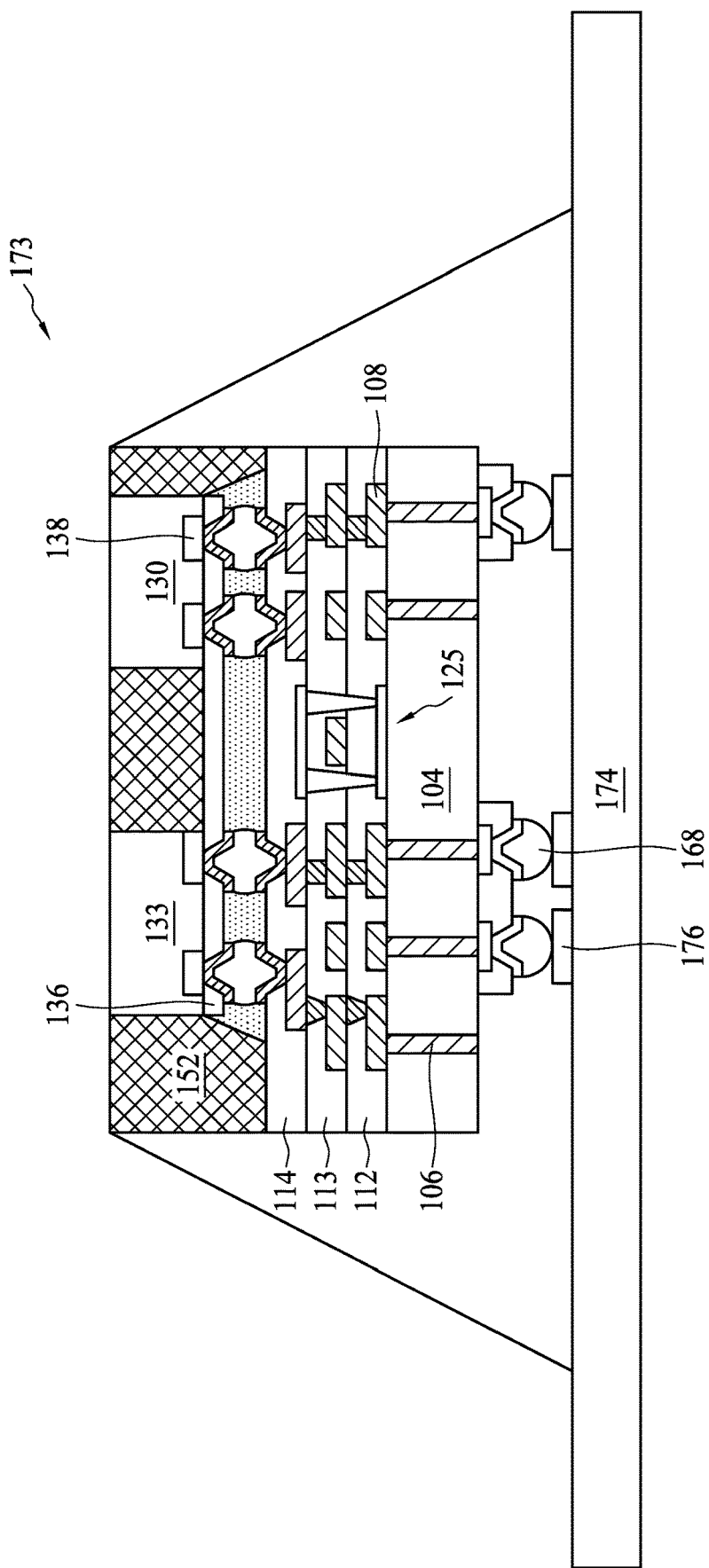
Figure 4O:
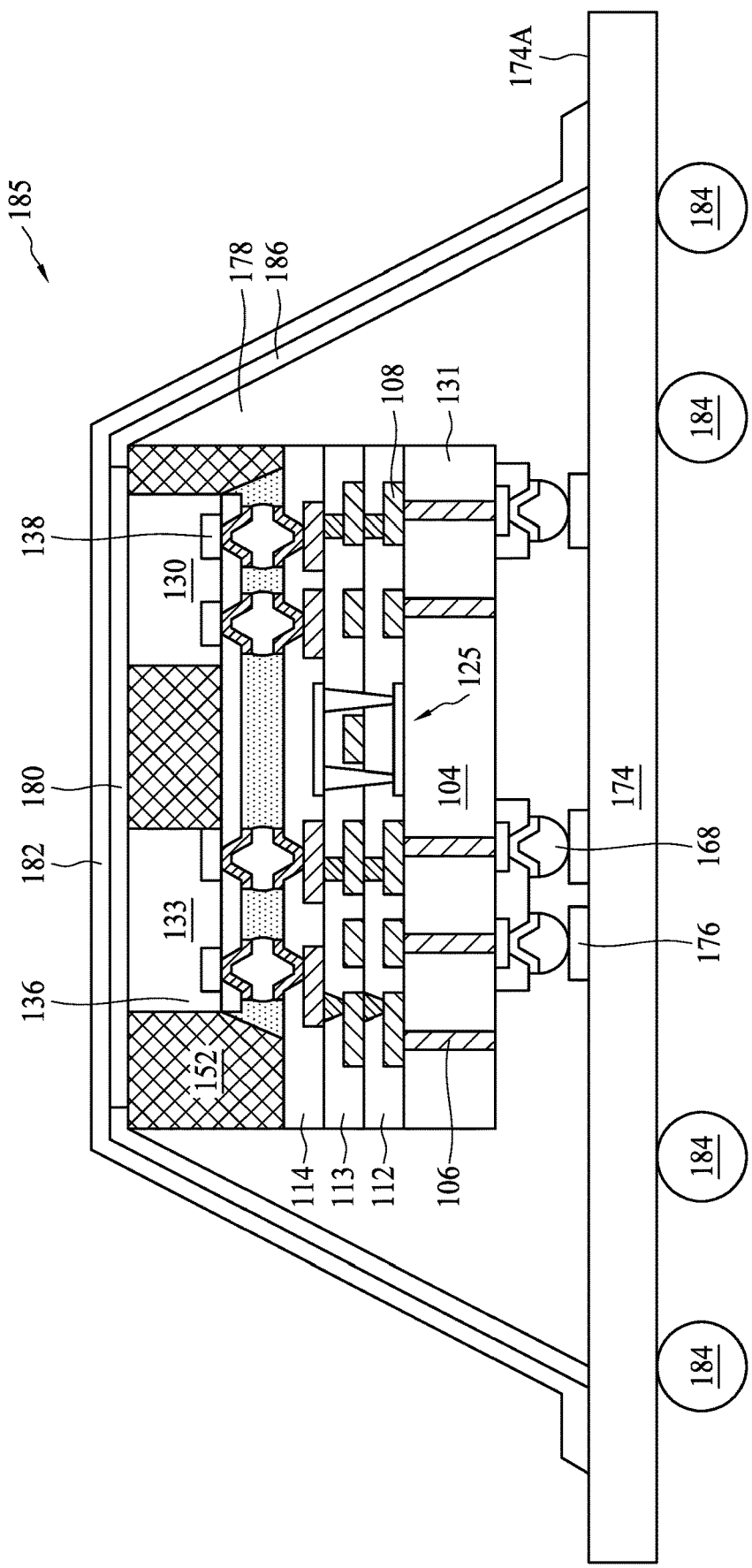

FIGS. 4A to 4O are cross-sectional views showing a method of forming a semiconductor device including the magnetic structure 125 as illustrated in FIG. 1, in accordance with some embodiments.

Referring to FIG. 4A, a lower layer 201 of the magnetic structure 125 is formed on the second surface 131B of the wafer 131. The lower layer 201 has a thickness of about 5 μm to about 40 μm. Various formation processes, such as deposition and patterning, may be performed to form the lower layer 201.

In an embodiment, a spin coating process is performed to form the lower layer 201. Suitable materials for the lower layer 201 in a spin coating process may include nickel (Ni), zinc (Zn), cooper iron oxide (Cu—Fe2O4) or combinations thereof. During the spin coating process, a material containing about 30% to about 50% Ni, about 30% to about 50% Zn, and about 15% to about 25% Cu—Fe2O4 is deposited to form the lower layer 201.

Alternatively, other materials for the lower layer 201 in a spin coating process may be used. These materials may include yttrium (Y), bismuth iron oxide (Bi—Fe5O12) or a combination thereof. During the spin coating process, a material containing about 70% to about 90% Y and about 15% to about 25% Bi—Fe5O12 is deposited to form the lower layer 201.

In another embodiment, an electroplating deposition process is performed to form the lower layer 201. Suitable materials for the lower layer 201 in an electroplating deposition process may include nickel (Ni), iron (Fe) or a combination thereof. Such material exhibits a relatively low hysteresis and a relatively high permeability. During the electroplating deposition process, a material containing about 70% to about 90% Ni and about 15% to about 25% Fe is deposited to form the lower layer 201.

In still another embodiment, a sputtering process is performed to form the lower layer 201. Suitable materials for the lower layer 201 in a sputtering process may include nickel (Ni), iron (Fe) or a combination thereof. During the sputtering process, a material containing about 70% to about 90% Ni and about 15% to about 25% Fe is deposited to form the lower layer 201.

Alternatively, other materials for the lower layer 201 in a sputtering process may be used. These materials may include cobalt (Co), tantalum (Ta), zirconium (Zr) or combinations thereof. During the sputtering process, a material containing about 90% to about 93% Co, about 4% to about 5% Ta, and about 3% to about 5% Zr is deposited to form the lower layer 201.

The conductive lines 108 and conductive vias 117 may be formed before or after the lower layer 201 is formed. Subsequently, a dielectric layer 112 is formed on the conductive lines 108, the conductive vias 117 and the lower layer 201. Exemplary processes for forming the conductive lines 108, conductive vias 117 and dielectric layer 112 have been described with reference to FIG. 1 and thus are not discussed.

Referring to FIG. 4B, conductive lines 128 are formed on the dielectric layer 112. A conductive line 128, which serves as transmission line and is disposed over the lower layer 201, is to be surrounded by a magnetic structure. Afterwards, conductive vias 117 are formed. Subsequently, a dielectric layer 113 is formed on the conductive lines 128 and the conductive vias 117. Exemplary processes for forming the conductive lines 128, conductive vias 117 and dielectric layer 113 have been described with reference to FIG. 1 and thus are not discussed.

Referring to FIG. 4C, openings 205 extending through the dielectric layer 113 are formed by, for example, a patterning and etching process. These openings 205 surround the transmission line 128 and expose the lower layer 201. In an embodiment, the openings 205 have a tapered profile that narrows down from a top surface of the dielectric layer 113 towards the lower layer 201.

Referring to FIG. 4D, the openings 205 are filled with a magnetic material, resulting in connecting vias 202 of the magnetic structure 125. Exemplary processes and materials for forming the lower layer 201, which have been described with reference to FIG. 4A, are applicable to form the connecting vias 202.

Referring to FIG. 4E, an upper layer 203 of the magnetic structure 125 is formed on the dielectric layer 113. Exemplary processes and materials for forming the lower layer 201, which have been described with reference to FIG. 4A, are applicable to forming the upper layer 203. The upper layer 203 is disposed over the transmission line 128 for magnetic connection with the lower layer 201 through the connecting vias 202. Accordingly, a magnetic structure surrounding the transmission line 128 and including the lower layer 201, the connecting vias 202 and the upper layer 203 is formed. In an embodiment, the upper layer 203 has a thickness of about 5 µm to about 40 µm.

Subsequently, the dielectric layer 114 is formed on the upper layer 203. Moreover, the connectors 118 are formed for electric connection with the connectors 140. Exemplary processes for forming the dielectric layer 114 and connectors 118 have been described with reference to FIG. 1 and thus are not discussed.

Referring to FIG. 4F, the dies 130, 133 are bonded to the wafer 131 through respective connectors 142. The bonding operation may be performed in a variety of processes. For example, a thermal reflow process is used to cause the connectors 140 and 118 in FIG. 1 to be softened. After a period of cooling, the connectors 140 and 118 are melted, and merged connectors 142 are formed accordingly between the dies 130, 133 and the wafer 131. The connectors 142 provide an attachment and an electrical connection between the dies 130, 133 and the wafer 131. In some embodiments, the connectors 142 may be conductive bumps, such as micro bumps or controlled collapse chip connection (C4) bumps. In some embodiments, the connectors 142 are formed with spherical shapes or non-spherical shapes.

Following the formation of the connectors 142, an underfill layer 150 fills some spaces between the dies 130 and the wafer 131. In some embodiments, the underfill layer 150 fills a gap between the connectors 142. In some embodiments, the underfill layer 150 covers an upper surface of the RDL 120. In some embodiments, the underfill layer 150 comprises a sidewall meeting a sidewall of the dies 130, 133. The underfill layer 150 provides a flexible compliant material surrounding the connectors 142 and an adhesion between the dies 130, 133 and the wafer 131. Further, the underfill layer 150 provides a stress relief during thermal cycling so as to prevent the connectors 142 and the dies 130, 133 from cracking.

In some cases, the underfill layer 150 comprises a dielectric material, and may be selected from encapsulating or molding materials, in some embodiments, the underfill layer 150 includes, for example, compliant epoxies that are liquid at temperatures above room temperature, and have rapid cure times especially at elevated temperatures and low viscosity during dispensing. In some embodiments, syringes or needles are utilized in dispensing the dielectric material of the underfill layer 150.

In some embodiments, the underfill layer 150 includes a first surface, which is adjacent to the RDL 120, being larger than a second surface, which is adjacent to the dies 130, 133. In some embodiments, the underfill layer 150 includes a tapered sidewall. In an embodiment, the underfill layer 150 may include a sidewall that slopes up from the dielectric layer 114 to the dielectric layer 136, thus sealing the gaps between the dies 130, 133 and the wafer 131.

A dielectric material 152 is formed over the RDL 120 of the wafer 131 and surrounds the dies 130, 133, The dielectric material 152 may be formed as an encapsulating layer surrounding the dies 130, 133, the connectors 142 or the RDL 120. In accordance with some embodiments, the dielectric material 152 covers the dielectric layer 136 and sidewalls of the dies 130, 133. In accordance with some embodiments, the dielectric material 152 covers a sidewall of the underfill layer 150. In some embodiments, the dielectric material 152 surrounds a perimeter of each of the dies 130, 133.

The dielectric material 152 may be a molding compound resin such as polyimide, polyphenylene sulphide (PPS), polyether ether ketone (PEEK), polyethersulfone (PES), a heat resistant crystal resin, or combinations thereof. In some embodiments, the dielectric material 152 may be formed with a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., N2-implanted $SiO_2$), silicon oxynitride ($Si_xO_yN_z$), and the like. In some embodiments, the dielectric material 152 may be a protective material such as polybenzoxazole (PBO), polyimide (PI), benzocyclobutene (BCB), silicon oxide, silicon nitride, silicon oxynitride, or any other suitable protective material.

In some cases, a portion of the dielectric material 152 is removed in an operation, which is referred to as a backside grinding process. An upper surface 152A of the dielectric material 152 is planarized in which excessive molding materials are ground by a planarization process, such as chemical mechanical polishing (CMP) operation or other mechanical processes. Accordingly, an upper surface 130A of each of the dies 130 is exposed. In some embodiments, the upper surface 130A is leveled with the upper surface 152A. In some embodiments, the upper surface 130A meets with the upper surface 152A. In other words, the upper surfaces 130A and 152A are arranged in a coplanar fashion.

Referring to FIG. 4G, the bonded structure of FIG. 4F is flipped over and another carrier 160 is provided for supporting the bonded structure. In addition, the carrier 102 in FIG. 4E is released or removed from the wafer 131. In some embodiments where the TSVs 106 are buried in the substrate material 104 of the wafer 131, a recessing or thinning operation may be performed in order to expose the TSVs 106 from a surface of the wafer 131. The thinning operation may include an etching operation, such as a dry etching or wet etching operation, a grinding, or a CMP process.

Referring to FIG. 4H, conductive pads 162 are formed over the respective exposed TSVs 106. In some embodiments, the conductive pads 162 are formed of a conductive material such as aluminum, copper, tungsten, or the like. The conductive pads 162 may be formed using a process such as CVD or PVD, although other suitable materials and methods may alternatively be utilized. As an exemplary operation, the formation for the conductive pads 162 may be performed by initially forming a conductive layer over the exposed surface 131A of the wafer 131. Then, a patterned photoresist (not separately shown) is formed or disposed over the conductive layer. The conductive pads 162 are formed by removing undesired portions of the conductive layer with the photoresist as a patterning mask. Additionally, subsequent to the formation of the conductive pads 162, a removal operation may be performed, for example by using an etching process, for removing the patterned photoresist.

Referring to FIG. 4I, a dielectric layer 164 may be formed over the conductive pads 162. In some embodiments, the dielectric layer 164 is patterned so as to have openings to expose the conductive pads 162. In some embodiments, the dielectric layer 164 may be formed as a passivation layer. The patterned dielectric layer 164 may be formed by a variety of techniques, e.g., CVD, LPCVD, PECVD, sputtering and physical vapor deposition, thermal growing, and the like. The patterned dielectric layer 164 may be formed with a variety of dielectric materials and may, for example, be an oxide (e.g., Ge oxide), an oxynitride (e.g., GaP oxynitride), silicon dioxide (SiO2), a nitrogen-bearing oxide (e.g., nitrogen-bearing SiO2), a nitrogen-doped oxide (e.g., N2-implanted SiO2), silicon oxynitride (SixOyNz), and the like.

Furthermore, several connectors 168 are formed over the conductive pads 162. The connectors 168 electrically couple the TSVs 106 with external components or devices through the conductive pads 162. The connectors 168 may be contact bumps such as controlled collapse chip connection (C4) bumps, ball grid array bumps or microbumps. The connectors 168 may comprise a conductive material such as tin, copper, tungsten, gold, silver, nickel, or the like. In accordance with some embodiments, a UBM 166 is formed between respective dielectric layer 164 and the connectors 168. The materials and formation processes for the UBM 166 may be similar to those UBMs as described and illustrated in FIG. 1, such as the UBM 138 for formation of the connectors 140 or the UBM 119 for the connectors 118.

Referring to FIG. 4J, the carrier 160 in FIG. 4I is removed from the bonded semiconductor structure 173. The bonded semiconductor structure 173 comprising the dies 130, 133 with the wafer 131, as shown in FIG. 4J, can be referred as CoW dies (e.g., dies 173-1 and 173-2), which are available for subsequent operations for forming a CoW-on-substrate (CoWoS) package.

Referring to FIG. 4K, the CoW dies 173 are disposed over a tape 170. In some embodiments, the tape 170 can be a die attach film (DAF), a dry film or a dicing tape. The tape 170 comprises adhesive materials to hold and fix the dies 173. Next, a dicing or singulation operation is performed against the CoW dies 173. In some embodiments, the dicing operation is performed by using a dicing blade 169. However, a laser may be alternatively used for performing the singulation operation. Accordingly, each of the singulated CoW dies 173 includes a group of dies 130 and a corresponding segmented wafer 131, which may also be referred to as an interposer substrate 131. As a result, a singulated. CoW die 173 comprises dies 130 along with corresponding interposer substrates 131, and may further include other features such as RDL 120, connectors 142, conductive pads 162, etc.

When the singulation operation is completed, CoW dies 173 are cut and separated from each other. A breaking mechanism used in the singulation operation may cut through the wafer 131, the dielectric layers 112, 113, 114, the dielectric material 152, and possibly through a depth of the tape 170.

Referring to FIG. 4L, the individual CoW dies 173 (either the die 173-1 or 173-2) are lifted from the tape 170 by using a detaching tool. In some embodiments, a pick and place tool may be used for picking up the individual CoW die 173 and moving it away from the tape 170. As an exemplary embodiment, a suction mechanism or an ejection pin may be utilized to raise a target die 173.

Referring to FIG. 4M, another substrate 174 is provided. The substrate 174 includes a semiconductor material, such as silicon. In one embodiment, the substrate 174 may include other semiconductor materials, such as silicon germanium, silicon carbide, gallium arsenide, or the like. In the present embodiment, the substrate 174 is a p-type semiconductive substrate (acceptor type) or n-type semiconductive substrate (donor type). Alternatively, the substrate 174 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 174 is a semiconductor-on-insulator (SOI), In other alternatives, the substrate 174 may include a doped epi layer, a gradient semiconductor layer, and/or a semiconductor layer overlying another semiconductor layer of a different type, such as a silicon layer on a silicon germanium layer.

Additionally, several conductive pads 176 are formed over a top surface of the substrate 174. The CoW die 173 is electrically bonded to the conductive pads 176 of the substrate 173 through the connectors 168. The bonded structure in FIG. 4M represents a CoW-on-Substrate (CoWoS) package device.

Referring to FIG. 4N, a dielectric layer 178 encapsulates the CoWoS structure. In an embodiment, the dielectric layer 178 laterally surrounds the CoW die 173, the connectors 168 and the conductive pads 176. The dielectric material 178 may be an underfill material. Alternatively, the dielectric material 178 may be a molding compound resin such as polyimide, PPS, PEEK, PES, a heat resistant crystal resin, or combinations thereof. In some embodiments, the dielectric material 178 may be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

Referring to 4O, a thermal interface material ("TIM") 180 is disposed over the dielectric layer 178. The TIM 180 may be dispensed after the CoW die 173 is molded by the dielectric material 178. The TIM 180 may be formed of a thermal conductive material. For example, the TIM 180 is formed of a phase change material and may change to a quasi-liquid phase when heated under a normal working temperature of the dies 130.

Furthermore, in an embodiment, a heat spreader 182 is disposed over the TIM 180. In some embodiments, the heat spreader 182 covers the CoW die 137, the TIM 180, the dielectric layer 178, and the substrate 174. The use of the heat spreader 182 or the TIM 180 improves the thermal performance of a packaged CoWoS die 185 and decreases the working temperatures of the dies 130.

In some embodiments, connectors 184 are formed on a bottom surface 174B of the substrate 174, where the surface 174B is facing away from the CoW die 173. The connectors 184 may be formed as micro bumps, controlled collapse chip bumps or ball grid array (BGA) bumps and may be connected to another semiconductor die, device or printed circuit board.

Figure 5A:
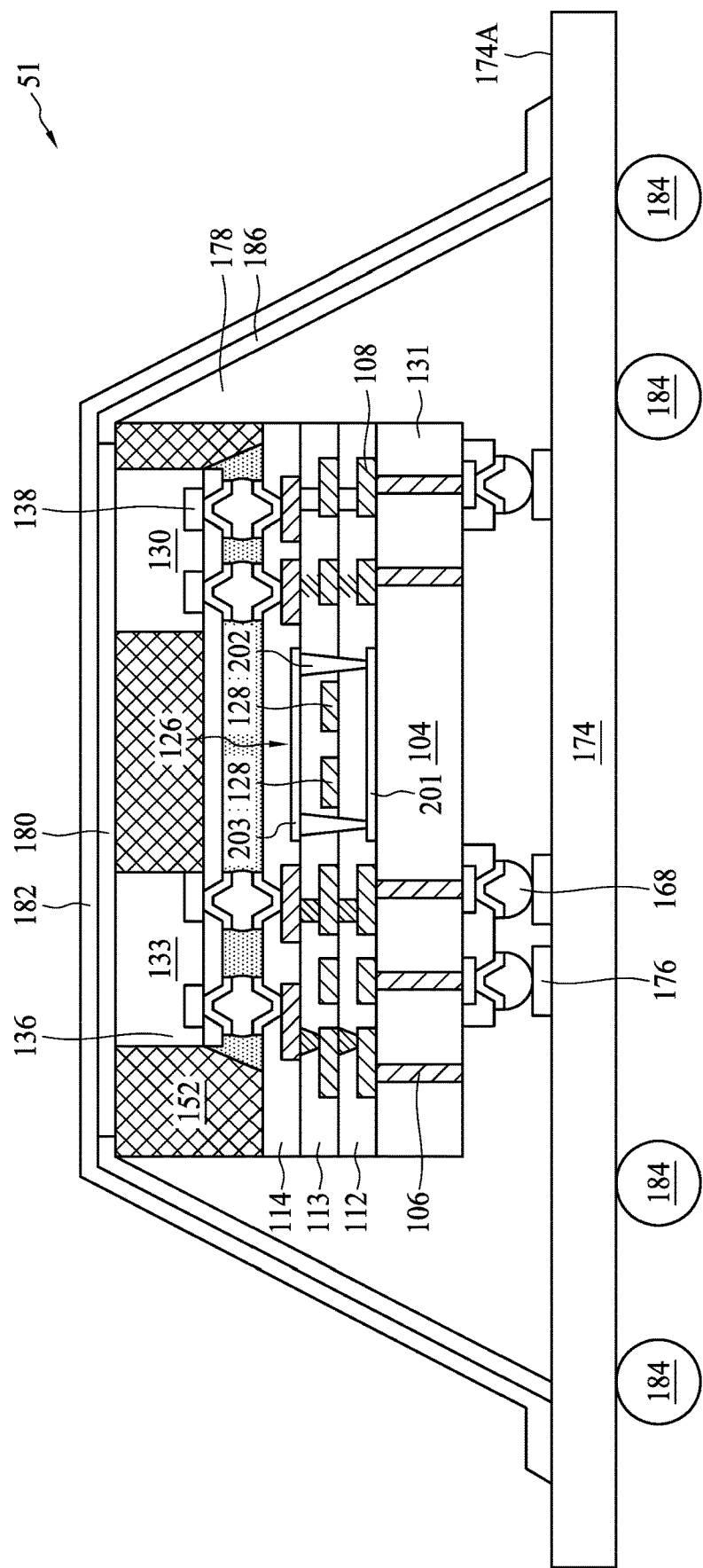
FIG. 5A is a cross-sectional view of a semiconductor device including a magnetic structure, in accordance with another embodiment.

FIG. 5A is a cross-sectional view of a semiconductor device 51 including a magnetic structure 126, in accordance with another embodiment.

Referring to FIG. 5A, the semiconductor device 51 is similar to the semiconductor device 185 described and illustrated with reference to FIG. 4O except that, for example, the magnetic structure 126 surrounds more than one transmission lines 128.

Figure 5B:
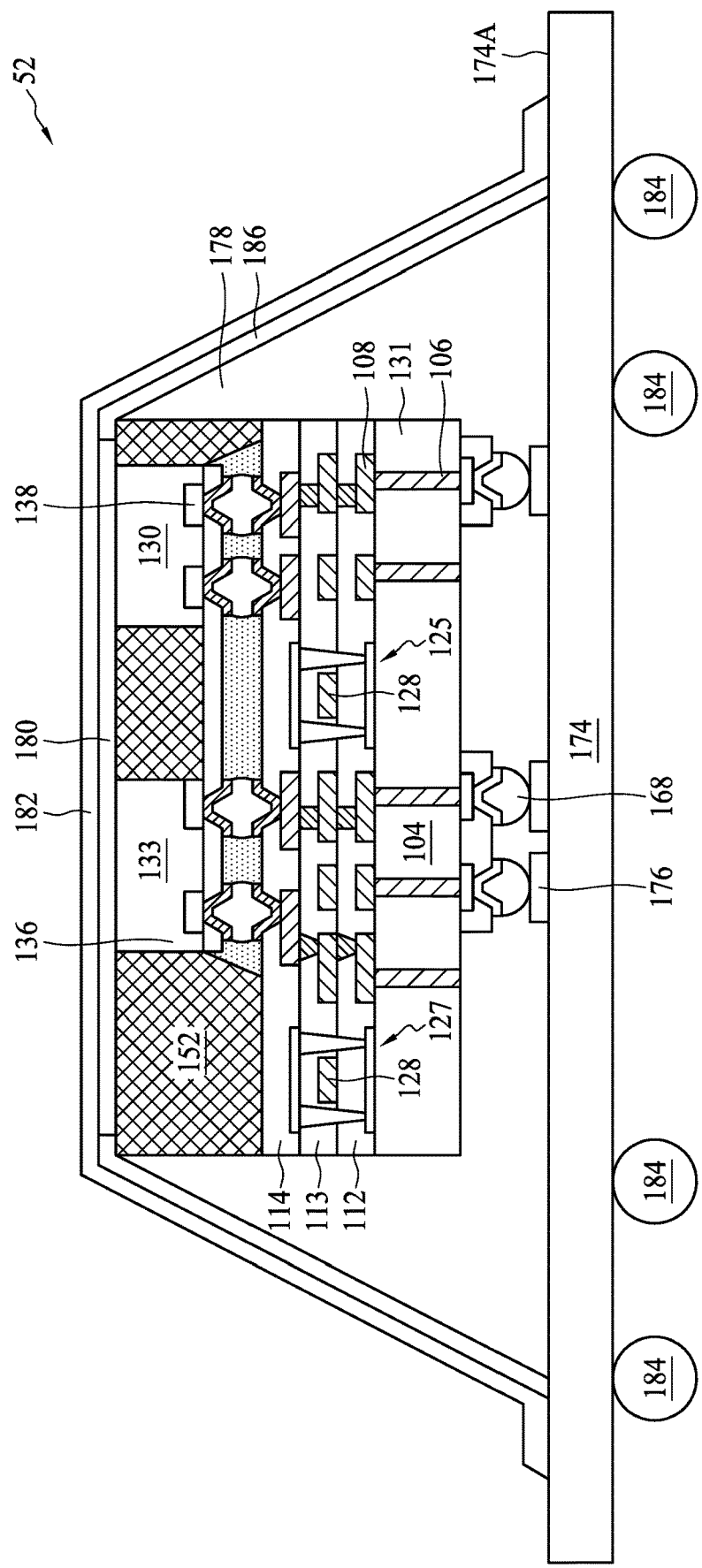
FIG. 5B is a cross-sectional view of a semiconductor device including magnetic structure, in accordance with yet another embodiment.

FIG. 5B is a cross-sectional view of a semiconductor device 52 including magnetic structures, in accordance with yet another embodiment.

Referring to FIG. 5B, the semiconductor device 52 is similar to the semiconductor device 185 described and illustrated with reference to FIG. 4O except that, for example, the semiconductor device 52 includes another magnetic structure 127 in addition to the magnetic structure 125. The magnetic structure 125 surrounds a transmission line 128, and the magnetic structure 127 surrounds another transmission line 128. The transmission lines 128 surrounded by the magnetic structures 125 and 127 extend in a same layer of the RDL 120.

Figure 5C:
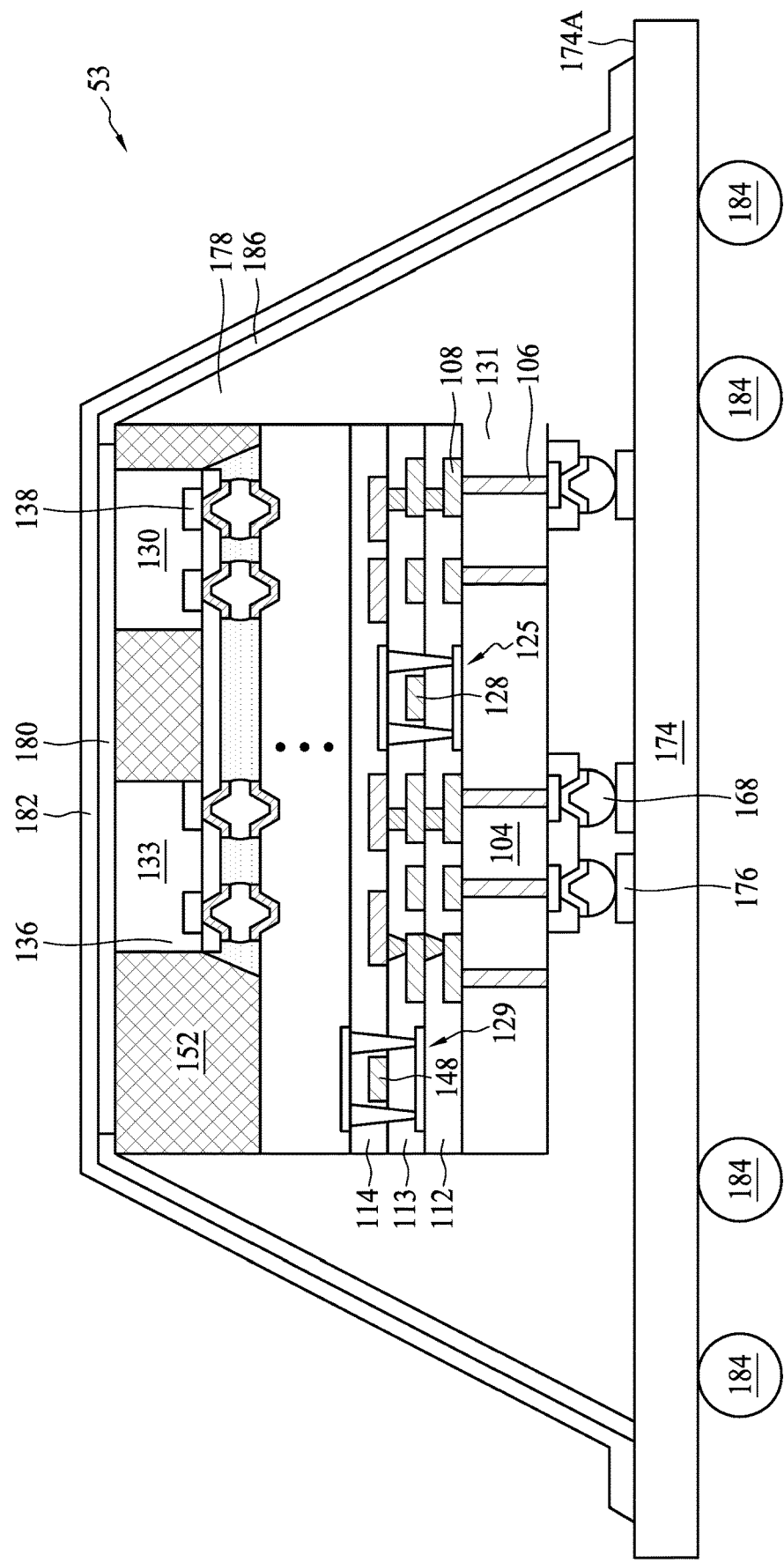
FIG. 5C is a cross-sectional view of a semiconductor device including a magnetic structure, in accordance with still another embodiment.

FIG. 5C is a cross-sectional view of a semiconductor device 53 including magnetic structures, in accordance with still another embodiment.

Referring to FIG. 5C, the semiconductor device 53 is similar to the semiconductor device 185 described and illustrated with reference to FIG. 4O except that, for example, the semiconductor device 53 includes another magnetic structure 129 in addition to the magnetic structure 125. The upper layer of the magnetic structure 129 is disposed at a higher level in the RDL 120 than the upper layer of the magnetic structure 125. The magnetic structure 129 surrounds another transmission line 148. The transmission lines 128 and 148 surrounded by the magnetic structures 125 and 129, respectively, extend in different layers of the RDL 120.

Embodiments of the present disclosure provide a semiconductor device. The semiconductor device includes a first die on a first substrate, a second die on a second substrate separate from the first substrate, a first transmission line in a redistribution layer on a wafer, and a first magnetic structure surrounding the first transmission line. The first transmission line is to electrically connect the first die and the second die. The first magnetic structure is configured to increase the characteristic impedance of the first transmission line.

Some embodiments of the present disclosure provide a method of forming semiconductor device. The method includes preparing a first die on a first substrate, preparing a second die on a second substrate, preparing a wafer, forming a magnetic structure while forming a redistribution layer over the wafer, and bonding the first die and the second die to the wafer. The magnetic structure surrounds a transmission line in the redistribution layer. The transmission line is to electrically connect the first die and the second die.

Embodiments of the present disclosure also provide a method of forming a semiconductor device. The method includes preparing a first die on a first substrate, preparing a second die on a second substrate, preparing a wafer, forming a first magnetic structure and a second magnetic structure while forming a redistribution layer over the wafer, and bonding the first die and the second die to the wafer. The first magnetic structure surrounds a first transmission line in the redistribution layer, and the second magnetic structure surrounds a second transmission line in the redistribution layer. At least one of the first transmission line and the second transmission line is to electrically connect the first die and the second die.

Embodiments of the present disclosure further provide a method of forming a semiconductor device. The method includes receiving a first die and a second die; forming a redistribution layer on a semiconductive material of a wafer; forming a first transmission line in the redistribution layer on the semiconductive material of the wafer; forming a first magnetic structure surrounding the first transmission line; bonding the first die and the second die to the redistribution layer; and forming an underfill material between the first die and the redistribution layer, and between the second die and the redistribution layer. The redistribution layer includes a plurality of dielectric layers. The first magnetic structure is configured to increase a characteristic impedance of the first transmission line. The first transmission line electrically connects the first die and the second die. The underfill material is directly over the first magnetic structure. The first magnetic structure is disposed between the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
preparing a first die on a first substrate;
preparing a second die on a second substrate;
preparing a wafer;
forming a magnetic structure while forming a redistribution layer over the wafer, the magnetic structure surrounding a transmission line in the redistribution layer, the transmission line to electrically connect the first die and the second die; and bonding the first die and the second die to the wafer,
wherein the forming of the magnetic structure and the transmission line further comprises:
forming a lower layer in a first dielectric layer over the wafer;
forming the transmission line in a second dielectric layer over the lower layer and the first dielectric layer;
forming at least a connecting via penetrating the first dielectric layer and the second dielectric layer to couple to the lower layer; and
forming an upper layer in a third dielectric layer over the second dielectric layer and the connecting via, wherein the lower layer, the connecting via and the upper layer form the magnetic structure,
wherein the forming of the redistribution layer further comprises forming a conductive line and a conductive via in the first dielectric layer prior to the forming of the transmission line,
wherein a bottom surface of the conductive line is leveled with a bottom surface of the lower layer of the magnetic structure, and a top surface of the conductive via is leveled a bottom surface of the transmission line.

2. The method of claim 1, wherein the forming of the magnetic structure comprises:
depositing a material containing 30% to 50% Ni, 30% to 50% Zn, and 15% to 25% Cu—Fe2O4 in a spin coating process.

3. The method of claim 1, wherein the forming of the magnetic structure comprises:
depositing a material containing 70% to 90% Y and 15% to 25% Bi—Fe5O12 in a spin coating process.

4. The method of claim 1, wherein the forming of the magnetic structure comprises:
depositing a material containing 70% to 90% Ni and 15% to 25% Fe in an electroplating deposition process.

5. The method of claim 1, wherein the forming of the magnetic structure comprises:
depositing a material containing 70% to 90% Ni and 15% to 25% Fe in a sputtering process.

6. The method of claim 1, wherein the forming of the magnetic structure comprises:
depositing a material containing 90% to 93% Co, 4% to 5% Ta, and 3% to 5% Zr in a sputtering process.

7. A method of forming a semiconductor device, the method comprising:
preparing a first die on a first substrate;
preparing a second die on a second substrate;
preparing a wafer;
forming a first magnetic structure and a second magnetic structure while forming a redistribution layer over the wafer, the first magnetic structure surrounding a first transmission line in the redistribution layer, the second magnetic structure surrounding a second transmission line in the redistribution layer, at least one of the first transmission line and the second transmission line to electrically connect the first die and the second die; and
bonding the first die and the second die to the wafer,
wherein the forming of the first magnetic structure, the second magnetic structure, the first transmission line and the second transmission line further comprises:
forming a first lower layer and a second lower layer in a first dielectric layer over the wafer;
forming the first transmission line and the second transmission line in a second dielectric layer over the first lower layer, the second lower layer and the first dielectric layer;
forming at least a first connecting via and at least a second connecting via penetrating the first dielectric layer and the second dielectric layer, wherein the first connecting via couples to the first lower layer, and the second connecting via couples to the second lower layer; and
forming a first upper layer and a second upper layer in a third dielectric layer over the second dielectric layer, wherein the first lower layer, the first connecting via and the first upper layer form the first magnetic structure, and the second lower layer, the second connecting via and the second upper layer form the second magnetic structure,
wherein the forming of the redistribution layer further comprises forming a conductive line and a conductive via in the first dielectric layer prior to the forming of the first transmission line and the second transmission line, and a bottom surface of the conductive line is leveled with a bottom surface of the first lower layer of the first magnetic structure and a bottom surface of the second lower layer of the second magnetic structure.

8. The method of claim 7, wherein the forming of one of the first magnetic structure and the second magnetic structure comprises:
depositing a material containing 30% to 50% Ni, 30% to 50% Zn, and 15% to 25% Cu—Fe2O4 in a spin coating process.

9. The method of claim 7, wherein the forming of one of the first magnetic structure and the second magnetic structure comprises:
depositing a material containing 70% to 90% Y and 15% to 25% Bi—Fe5O12 in a spin coating process.

10. The method of claim 7, wherein the forming of one of the first magnetic structure and the second magnetic structure comprises:
depositing a material containing 70% to 90% Ni and 15% to 25% Fe in an electroplating deposition process.

11. The method of claim 7, wherein the forming of one of the first magnetic structure and the second magnetic structure comprises:
depositing a material containing 70% to 90% Ni and 15% to 25% Fe in a sputtering process.

12. The method of claim 7, wherein the forming of one of the first magnetic structure and the second magnetic structure comprises:
depositing a material containing 90% to 93% Co, 4% to 5% Ta, and 3% to 5% Zr in a sputtering process.

13. A method of forming a semiconductor device, comprising:
receiving a first die and a second die;
forming a redistribution layer on a semiconductive material of a wafer, wherein the redistribution layer comprises a plurality of dielectric layers;
forming a first transmission line in the redistribution layer on the semiconductive material of the wafer;
forming a first magnetic structure surrounding the first transmission line, the first magnetic structure configured to increase a characteristic impedance of the first transmission line;
bonding the first die and the second die to the redistribution layer, wherein the first transmission line electrically connects the first die and the second die; and
forming an underfill material between the first die and the redistribution layer, and between the second die and the redistribution layer, wherein the underfill material is directly over the first magnetic structure, wherein the first magnetic structure is disposed between the first die and the second die, wherein the forming of the first magnetic structure and the first transmission line further comprises:

forming a first lower layer in a first dielectric layer of the plurality of dielectric layers;

forming the first transmission line in a second dielectric layer of the plurality of dielectric layers over the lower layer and the first dielectric layer;

forming at least a first connecting via penetrating the first dielectric layer and the second dielectric layer to couple to the lower layer; and forming a first upper layer in a third dielectric layer of the plurality of dielectric layers over the second dielectric layer and the first connecting via, wherein the first lower layer, the first connecting via and the first upper layer form the first magnetic structure, wherein the forming of the redistribution layer further comprises forming a conductive line and a conductive via in the first dielectric layer prior to the forming of the first transmission line, and a top surface of the conductive via is leveled a bottom surface of the transmission line.

14. The method of claim 13, further comprising forming a dielectric material over the redistribution layer, wherein the dielectric material surrounds the first die, the second die and the underfill material.

15. The method of claim 14, wherein a top surface of the dielectric material is leveled with a top surface of the first die and a top surface of the second die.

16. The method of claim 14, wherein a sidewall of the dielectric material is aligned with a sidewall of the redistribution layer and a sidewall of the semiconductive material of the wafer.

17. The method of claim 13, further comprising:

forming a second transmission line in the redistribution layer on the semiconductive material of the wafer; and forming a second magnetic structure surrounding the second transmission line, wherein the second magnetic structure is configured to increase a characteristic impedance of the second transmission line.

18. The method of claim 17, wherein a bottom surface of the first transmission line is leveled with a bottom surface of the second transmission line.

19. The method of claim 17, wherein a bottom surface of the first transmission line and a bottom surface of the second transmission line are in different levels.

20. The method of claim 17, wherein the forming of the second magnetic structure and the second transmission line further comprises:

forming a second lower layer in the first dielectric layer;

forming the second transmission line in the second dielectric layer;

forming at least a second connecting via penetrating the first dielectric layer and the second dielectric layer to couple to the second lower layer; and forming a second upper layer in the third dielectric layer, wherein the second lower layer, the second connecting via and the second upper layer form the second magnetic structure.

* * * * *